United States Patent [19]
Uchida et al.

[11] Patent Number: 5,214,302
[45] Date of Patent: May 25, 1993

[54] SEMICONDUCTOR INTEGRATED CIRCUIT DEVICE FORMING ON A COMMON SUBSTRATE MISFETS ISOLATED BY A FIELD OXIDE AND BIPOLAR TRANSISTORS ISOLATED BY A GROOVE

[75] Inventors: Akihisa Uchida, Tachikawa; Keiichi Higeta; Nobuo Tamba, both of Ohme; Masanori Odaka, Kodaira; Katsumi Ogiue, Hinode, all of Japan

[73] Assignee: Hitachi, Ltd., Tokyo, Japan

[21] Appl. No.: 807,411

[22] Filed: Dec. 13, 1991

Related U.S. Application Data

[63] Continuation of Ser. No. 564,685, Aug. 3, 1990, abandoned, which is a continuation of Ser. No. 189,817, May 3, 1988, abandoned.

[30] Foreign Application Priority Data

May 13, 1987 [JP] Japan ................... 62-116090

[51] Int. Cl.$^5$ .................. H01L 27/02; H01L 27/12; H01L 29/06
[52] U.S. Cl. .................. 257/370; 257/374; 257/506; 257/586; 257/588; 257/622; 257/623; 257/755; 257/756; 257/757
[58] Field of Search .......... 357/34, 35, 43, 55, 357/56, 67, 71, 49, 42, 59

[56] References Cited

U.S. PATENT DOCUMENTS

| | | | |
|---|---|---|---|
| 4,488,351 | 12/1984 | Momose ................ | 357/23.3 |
| 4,492,008 | 1/1985 | Anantha et al. ........ | 357/35 |
| 4,654,958 | 4/1987 | Baerg et al. ........... | 437/56 |
| 4,707,456 | 11/1987 | Thomas et al. ........ | 357/43 |
| 4,729,965 | 3/1988 | Tamaki et al. ........ | 357/34 |
| 4,748,487 | 5/1988 | Uchida et al. ......... | 357/45 |
| 4,753,709 | 6/1988 | Welch et al. .......... | 357/59 |
| 4,764,480 | 8/1988 | Vora ..................... | 357/42 |
| 4,774,204 | 9/1988 | Havemann ............ | 357/42 |
| 4,799,099 | 1/1989 | Verret et al. .......... | 357/34 |
| 4,824,796 | 4/1989 | Chiu et al. ............. | 357/43 |
| 4,825,281 | 4/1989 | Nakazato et al. ...... | 357/34 |
| 5,068,710 | 11/1991 | Owada et al. ......... | 357/56 |

FOREIGN PATENT DOCUMENTS 2168845 7/1986 United Kingdom ............ 357/34

OTHER PUBLICATIONS

S. M. Sze, *Semiconductor Devices Physics and Technology*, John Wiley & Sons (1985) p. 326.

Primary Examiner—J. Carroll
Attorney, Agent, or Firm—Antonelli, Terry, Stout & Kraus

[57] ABSTRACT

A semiconductor integrated circuit device having a structure in which each of the following regions, that is, a first region for forming the base and emitter regions of each of the bipolar transistors, a second region for forming the collector lead-out region of the bipolar transistor, and a third region for forming each of the MISFETs, is projected from the main surface of a semiconductor substrate, whereby it is possible to effect isolation between the MISFETs and between these MISFETs and the bipolar transistors with the same isolation structure and in the same manufacturing step as those for the isolation between the bipolar transistors. In this device, furthermore, the base region of the bipolar transistor is electrically and self-alignedly connected to a base electrode which is formed over the main surface so as to surround the emitter region. The bipolar transistor is characterized as a self-alignment transistor and that the insulating side wall spacers corresponding to the gate and base (emitter) electrodes are formed by a same lever.

24 Claims, 26 Drawing Sheets

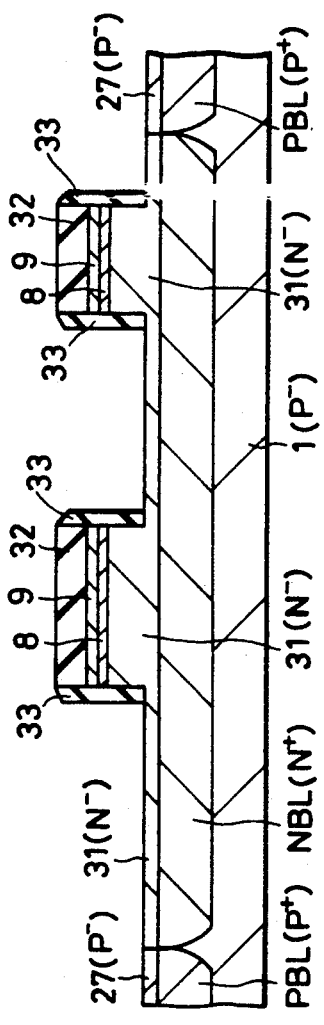
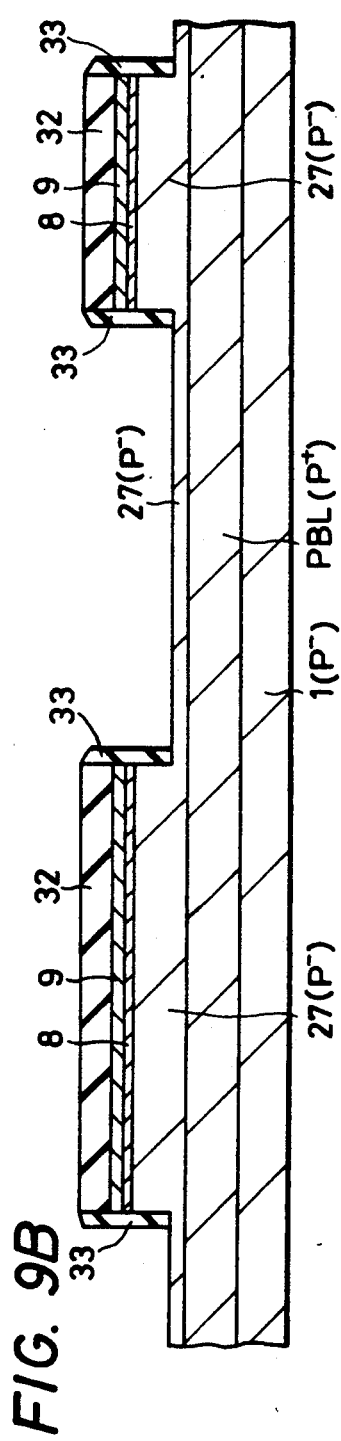
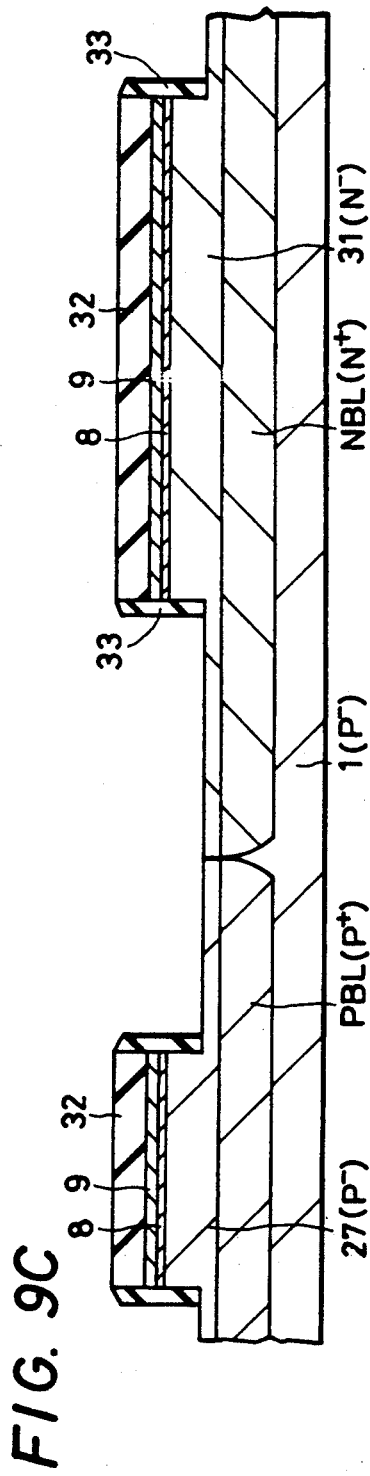
FIG. 9A
FIG. 9B
FIG. 9C

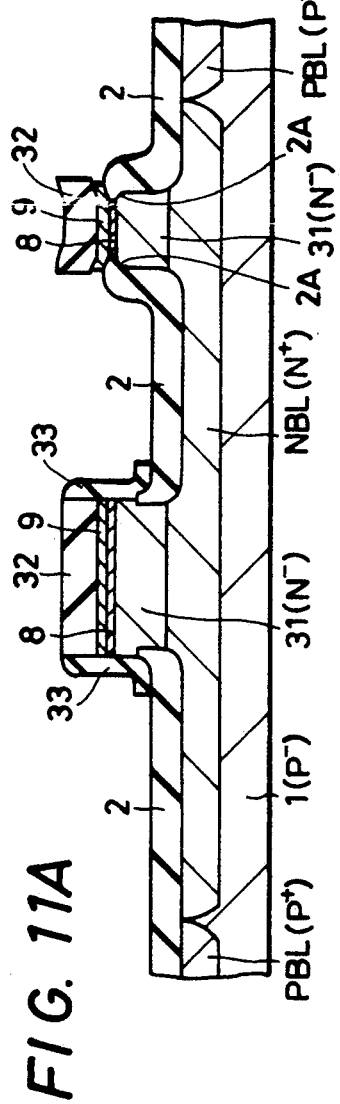
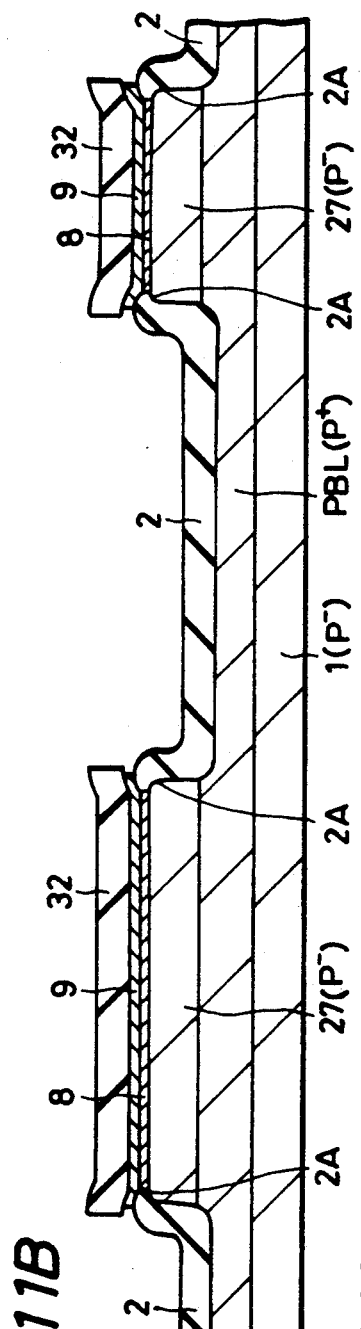
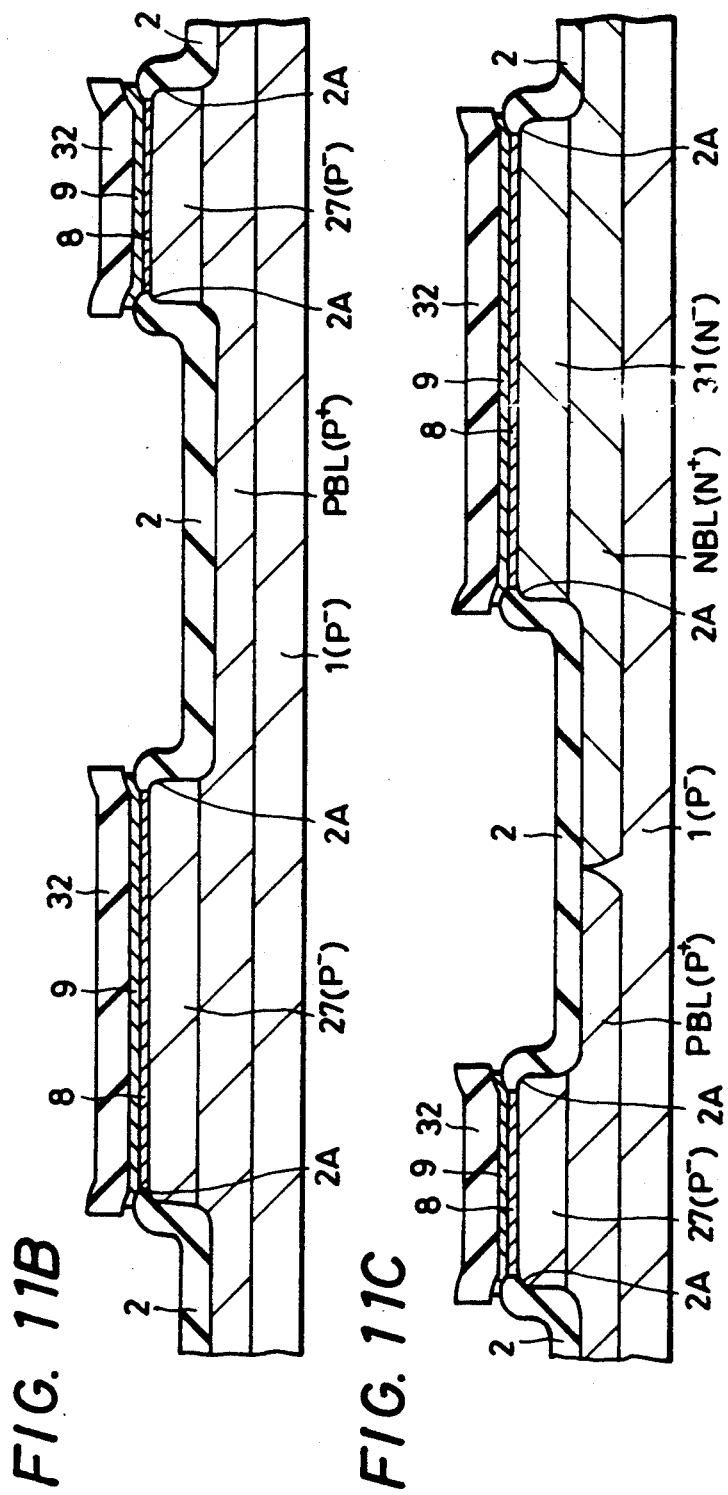
FIG. 11A
FIG. 11B
FIG. 11C

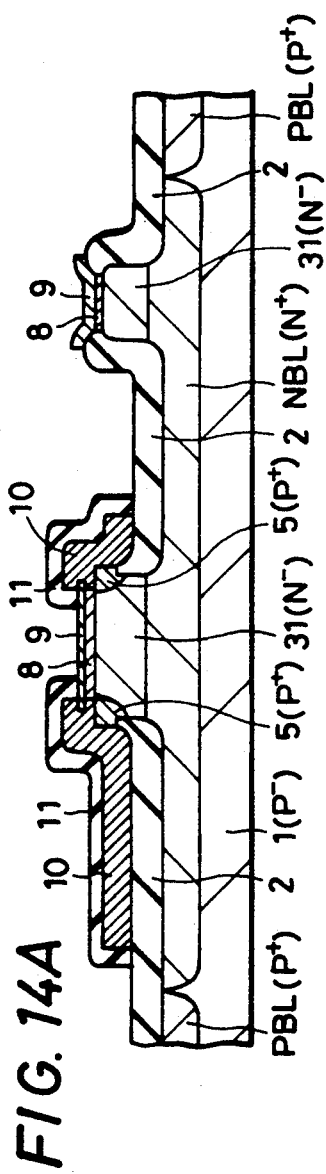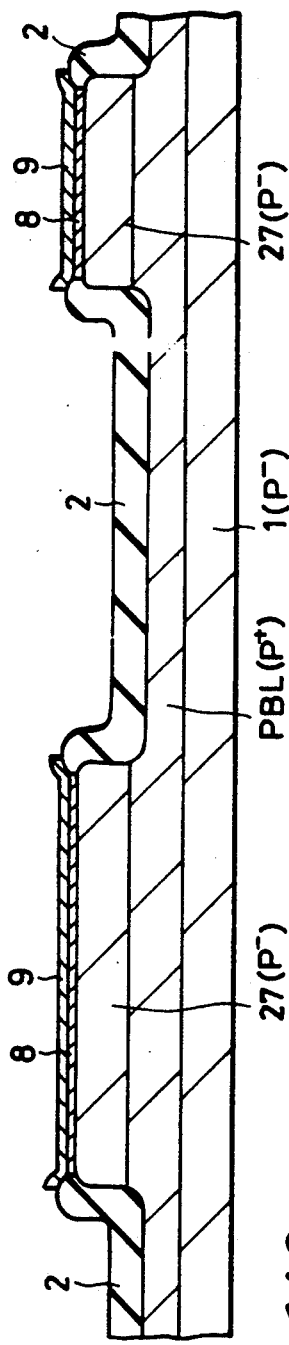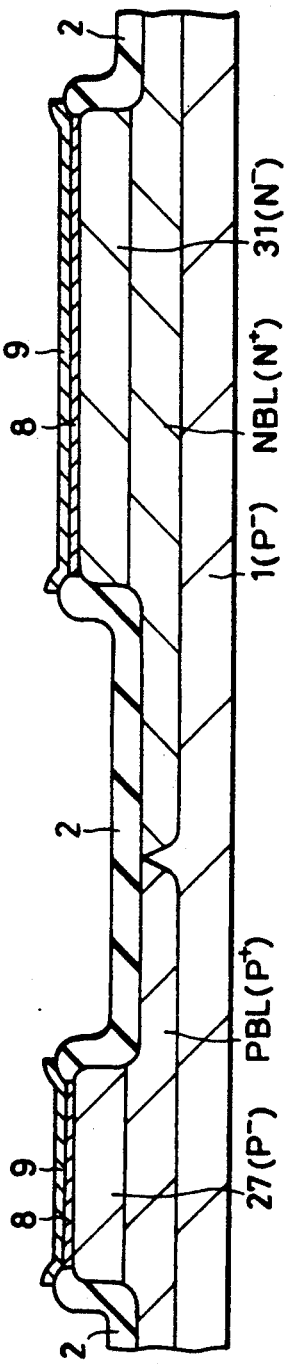

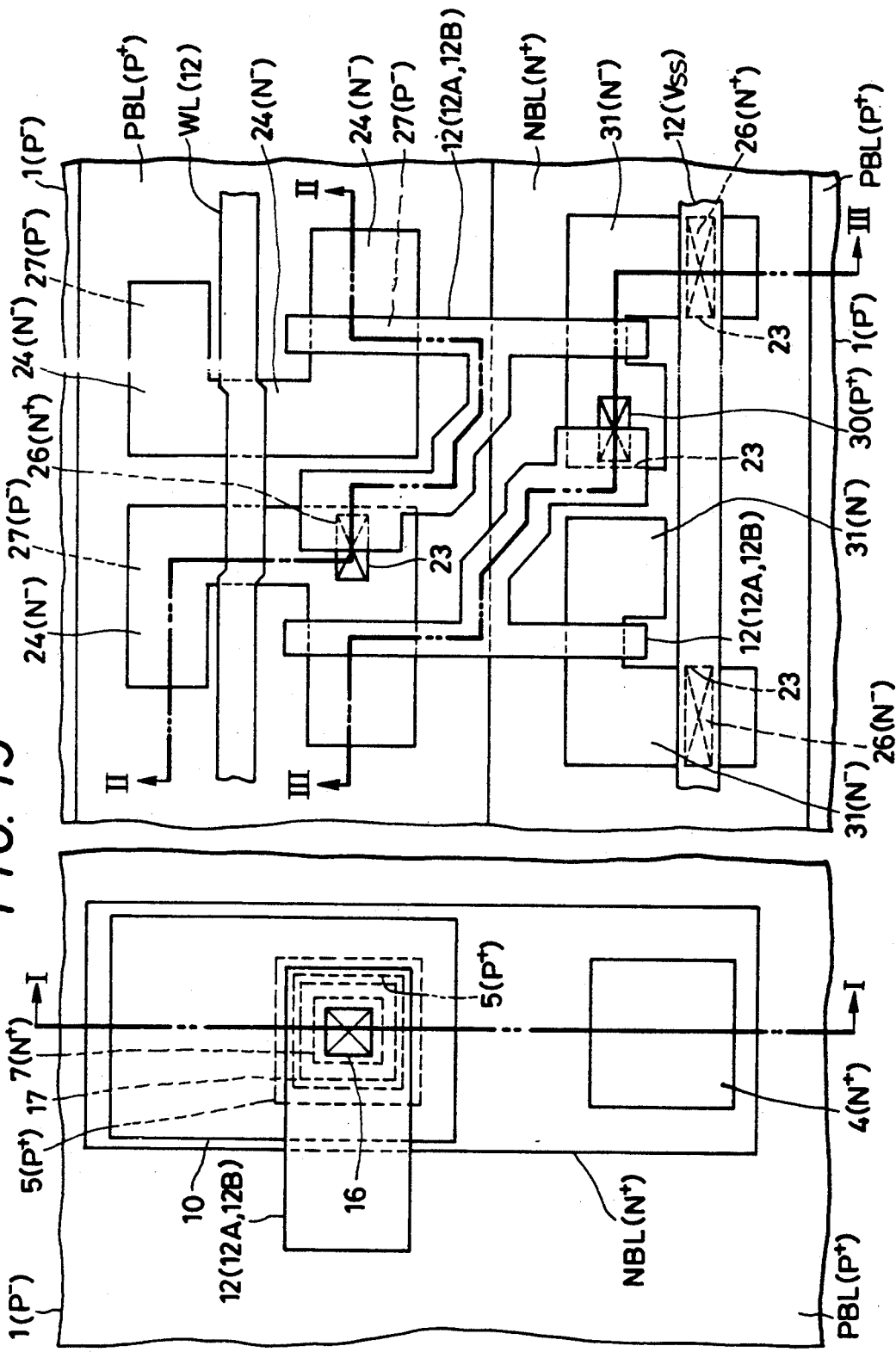

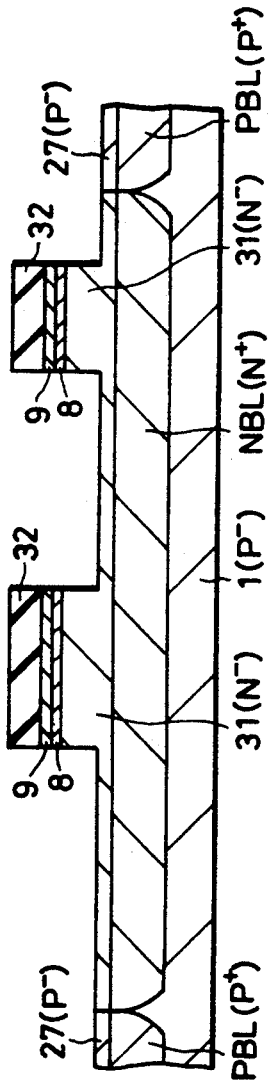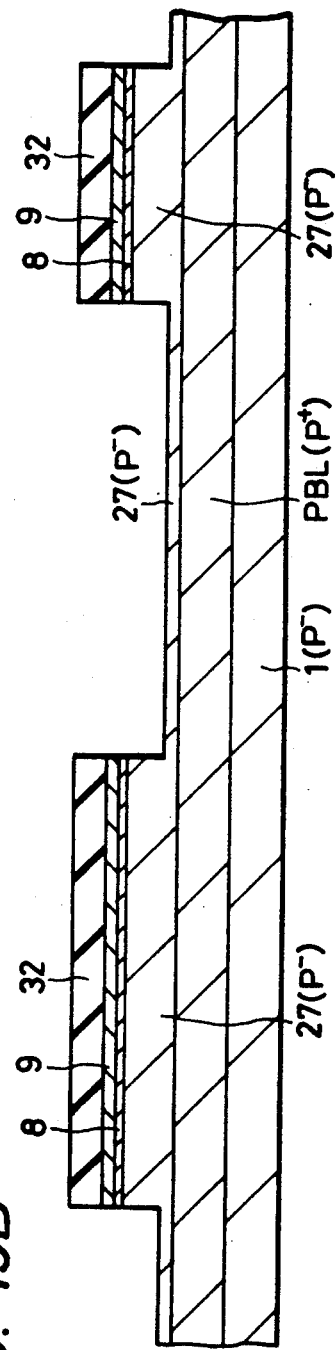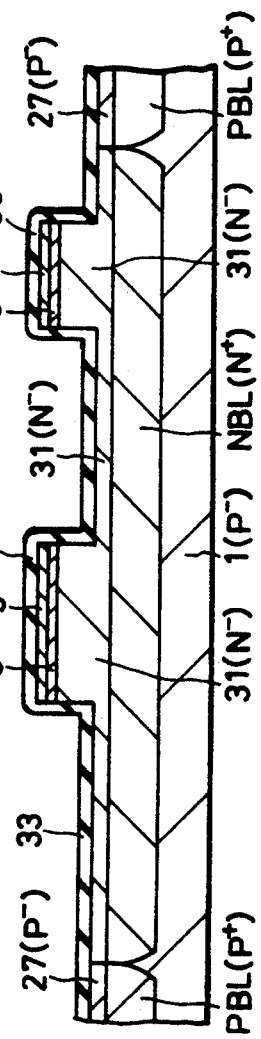

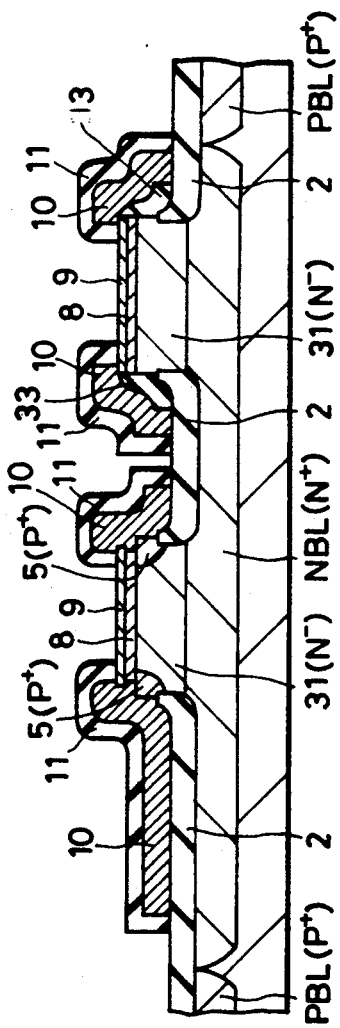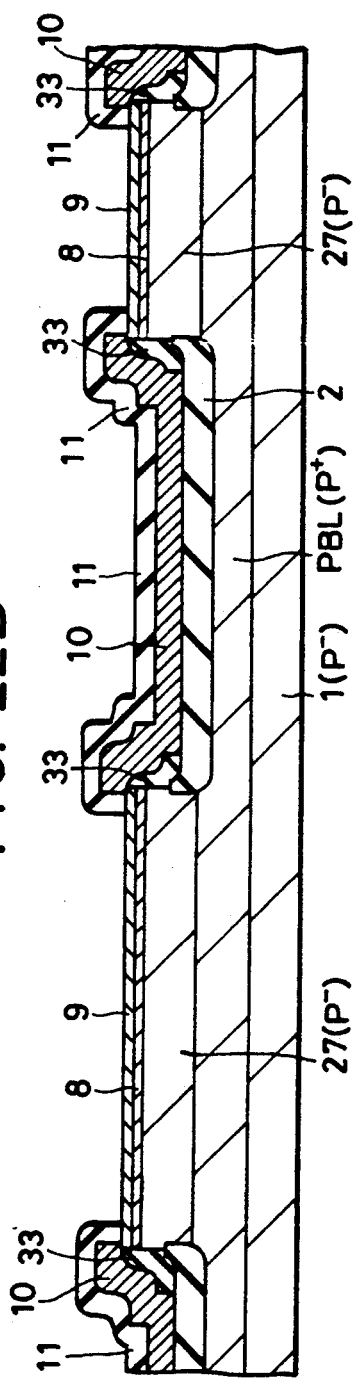

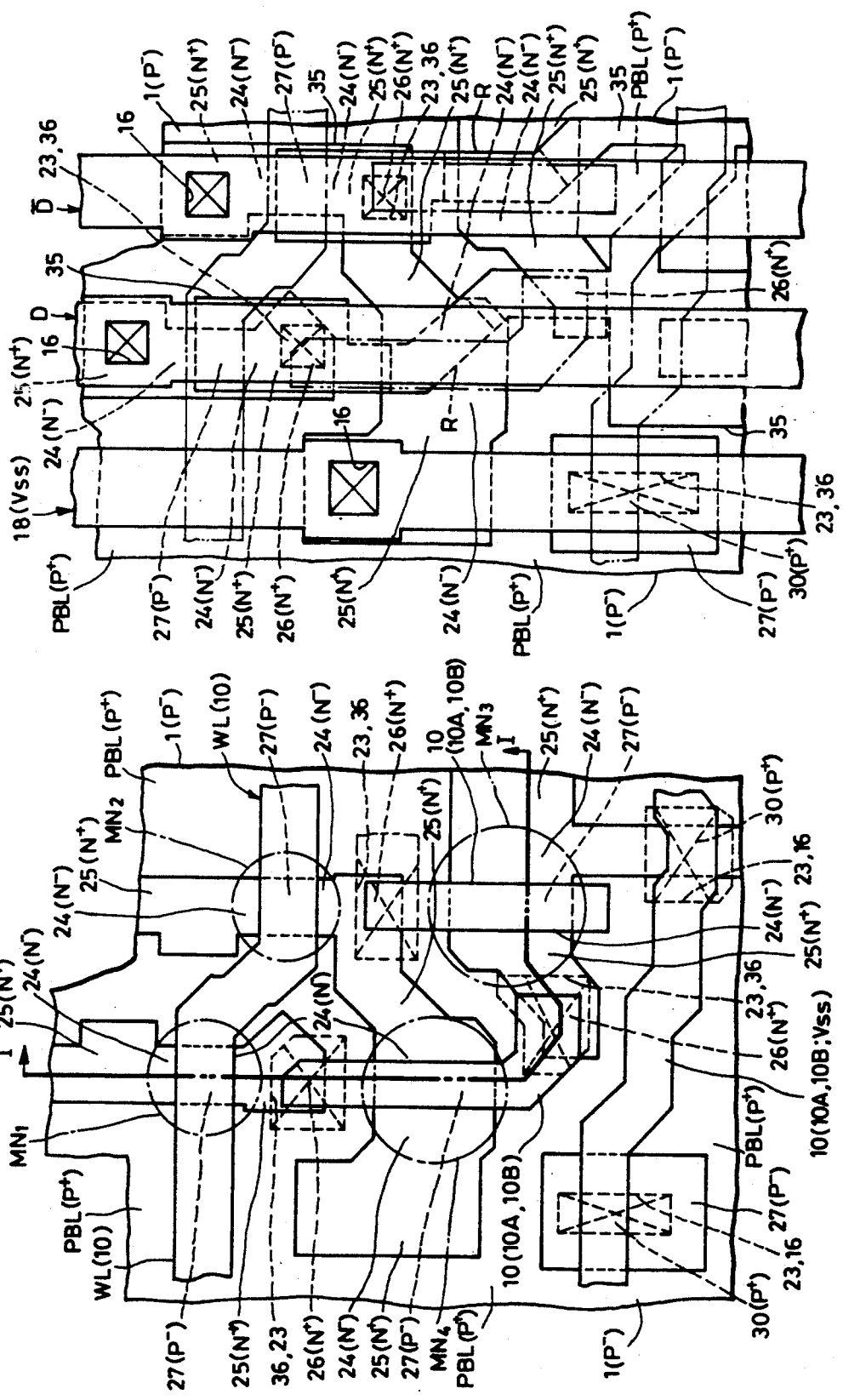

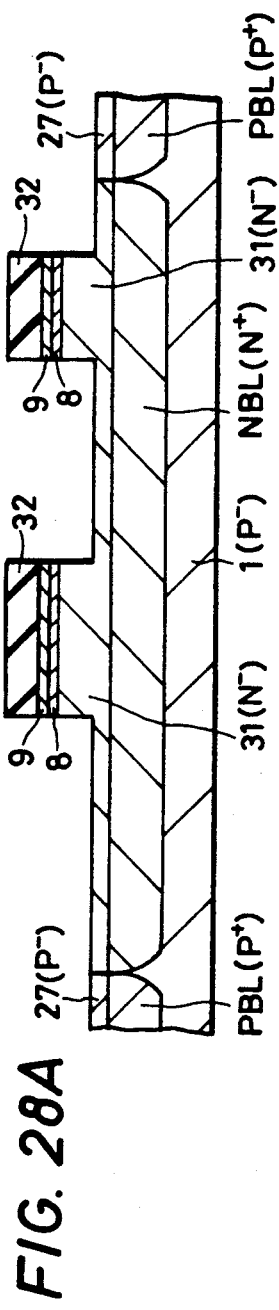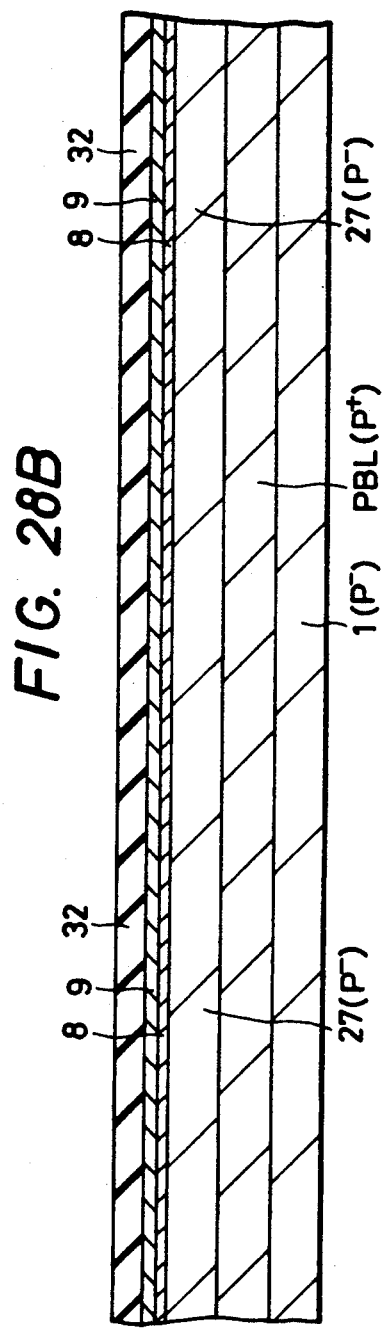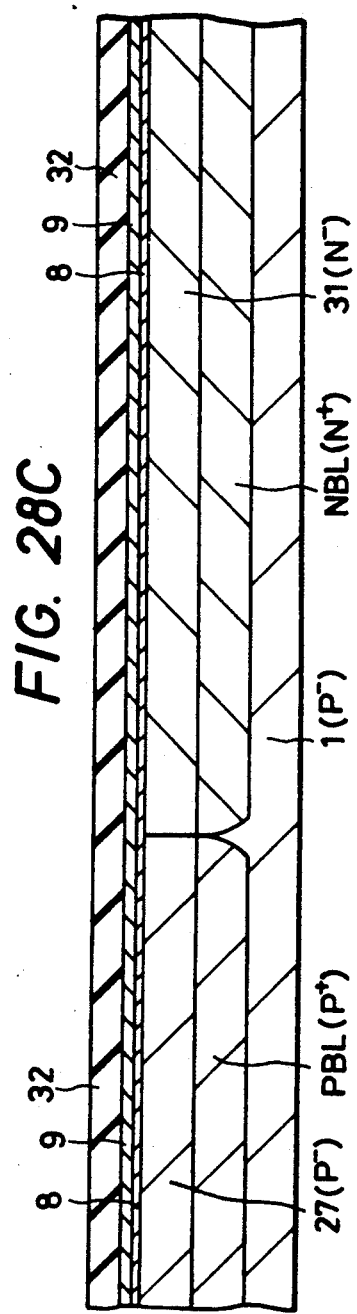

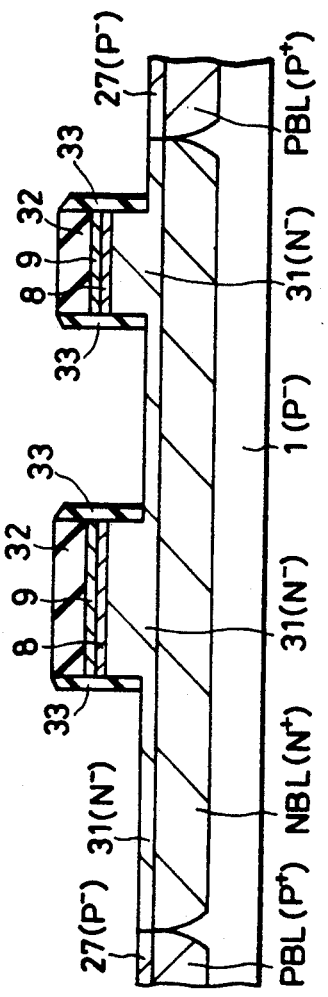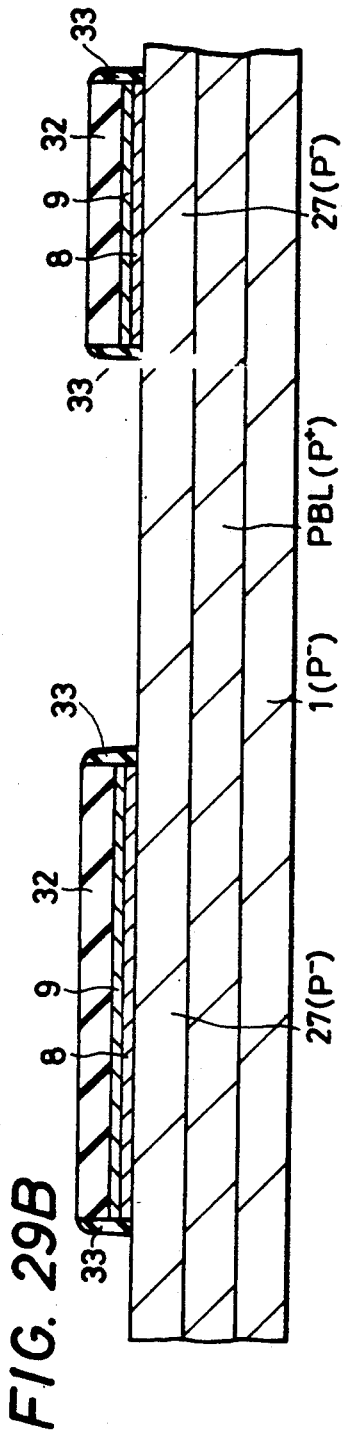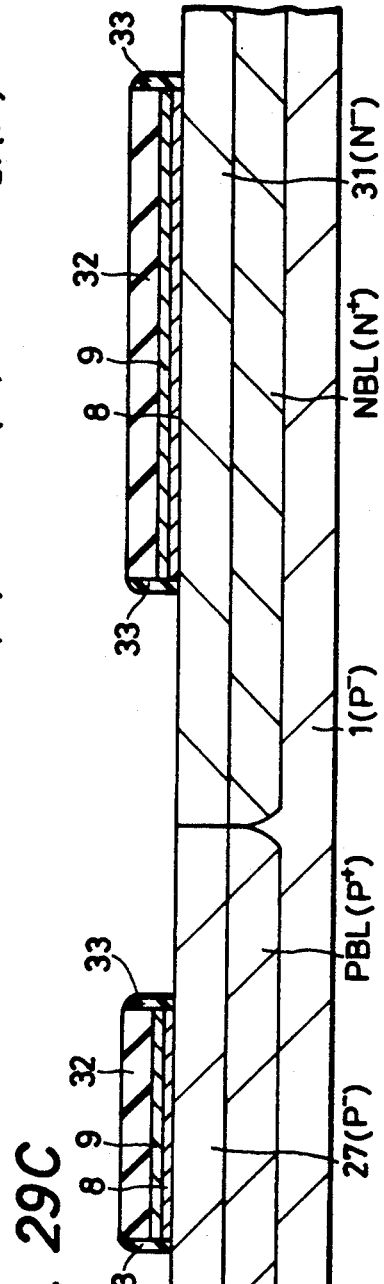

SEMICONDUCTOR INTEGRATED CIRCUIT DEVICE FORMING ON A COMMON SUBSTRATE MISFETS ISOLATED BY A FIELD OXIDE AND BIPOLAR TRANSISTORS ISOLATED BY A GROOVE

This application is a continuation of application Ser. No. 07/564,685, filed on Aug. 3, 1990, abandoned, which is a continuation of Ser. No. 07/189,817, filed May 3, 1988, abandoned.

BACKGROUND OF THE INVENTION

The present invention relates to a semiconductor Integrated circuit device and, more particularly, to a technique which may be effectively applied to a semiconductor integrated circuit device having bipolar transistors and MISFETs provided on the same substrate.

Japanese Patent Application No. 59-225738 (1984) discloses one type of bipolar transistor which is called an SICOS (Side Wall Base Contact Structure) bipolar transistor. In this transistor, the base electrode is self-alignedly connected to the base region, and the emitter region is self-alignedly formed with respect to the base electrode and the base region. For this reason, it is possible to produce a small transistor and achieve an increase in the operation speed of the device.

The present inventors studied an integrated circuit formed using bipolar transistors of the type described above.

The above-described type of bipolar transistor is superior in both the operation speed and driving capability but inferior to MISFETs in terms of capability in reducing the size of the device. Accordingly, the present inventors contrived to use the above-described SICOS bipolar transistors to constitute a portion of an integrated circuit which is regarded as requiring high-speed operation capability and high driving capability and employ MISFETs to constitute a portion of the circuit in which miniaturization is regarded as important.

SUMMARY OF THE INVENTION

It is necessary to form a field insulating film for isolation between SICOS bipolar transistors and between MISFETs and also between the SICOS bipolar transistors and the MISFETs.

However, the method of forming a field insulating film of an integrated circuit which comprises SICOS bipolar transistors differs from that of an integrated circuit comprising MISFETs. Therefore, if SICOS bipolar transistors and MISFETs are formed on the same substrate, the process for forming field insulating films is complicated.

It is an object of the present invention to provide a semiconductor integrated circuit device including bipolar transistors each having its base electrode self-alignedly connected to its base region and MISFETs, which are formed on the same substrate, the device being so designed that isolation of the elements is facilitated.

It is another object of the present invention to provide a technique for use in a semiconductor integrated circuit device including bipolar transistors each having its base electrode self-alignedly connected to its base region and MISFETs, which are formed on the same substrate, wherein isolation between the bipolar transistors and isolation between the MISFETs are effected in the same manufacturing step.

It is still another object of the present invention to provide a technique which enables high integration in a semiconductor integrated circuit device including bipolar transistors each having its base electrode self-alignedly connected to its base region and MISFETs in each of which a part of each of the source and drain regions is constituted by a lightly-doped layer, the bipolar transistors and the MISFETs being formed on the same substrate.

It is a further object of the present invention to provide a technique which enables minimization of undesired dimensional change or flattening of the surface of a semiconductor substrate in a semiconductor integrated circuit device including bipolar transistors each having its base electrode self-alignedly connected to the side surface of its base region and MISFETs, which are formed on the same substrate.

The above and other objects and novel features of the present invention will become clear from the following description taken in conjunction with the accompanying drawings.

A typical one of the inventions disclosed in this application will be briefed in the following.

In a semiconductor integrated circuit device including bipolar transistors each having its base electrode or, more specifically, the base lead-out electrode self-alignedly connected to its base region and MISFETs which are formed on the same substrate, a first region for forming the base and emitter regions of each bipolar transistor, a second region for forming the collector lead-out regions of the bipolar transistor, and a third region for forming each MISFET are formed so as to project or protrude upwardly from the surface of the substrate.

The present invention also provides a process for producing a semiconductor integrated circuit device including bipolar transistors each having its base electrode, i.e., base lead-out electrode, self-alignedly connected to the side surface of its base region and MISFETs, which are formed on the same substrate, the process comprising the steps of: forming a first mask on each of the following three regions on the substrate, that is, a first region in which the base and emitter regions of each bipolar transistor are provided, a second region in which the collector lead-out region of the bipolar transistor are provided, and a third region in which each MISFET is provided; etching the periphery of each of the first, second and third regions to project each of the first, second and third region as respective protruding regions; forming a second mask on the side surface of the first projecting (protruding) region; and oxidizing the surface of the substrate which is not covered with the first nor second mask to thereby form an element isolation insulating film (field insulating film).

A side wall which is provided on the side of the gate electrode of each MISFET to regulate a part of each of the source and drain regions is formed in the same manufacturing step as that for forming a side wall which is provided on the side wall of the base lead-out electrode of each bipolar transistor to regulate its emitter region.

The field insulating film around the second projecting (protruding) region and that around the third projecting (protruding) region are not provided on the upper surfaces of these regions but disposed only on the side surfaces thereof in the same way as in the case of the field insulating film provided around the first projecting region.

According to the above-described means, it is possible to use the same element isolation structure for isolation between the bipolar transistors for the isolation between the MISFETs and also between the bipolar transistors and the MISFETs. Accordingly, it is possible to obtain a semiconductor integrated circuit device which enables element isolation to be readily effected.

Since the technique for element isolation between the bipolar transistors is employed for the element isolation between the MISFETs and also between the MISFETs and the bipolar transistors, it is possible to effect isolation between these semiconductor elements in the same manufacturing step, i.e. during the formation of a same level layer.

The distance between the base electrode and emitter region of each bipolar transistor and that between the heavily-doped region of the source/drain region and the gate electrode of each MISFET having the LDD structure are regulated by respective side walls which are formed in the same manufacturing step. Therefore, it is possible to reduce the distance between these portions and hence achieve high integration without increasing the number of manufacturing steps.

Since there is no fear of the field insulating film undesirably extending into the periphery of the collector lead-out region of each bipolar transistor and the periphery of the MISFET region, it is possible to minimize the possible dimensional change.

BRIEF DESCRIPTION OF THE DRAWINGS

FIGS. 5A to 16C are plan or sectional views showing the steps of manufacturing the embodiment I.

FIGS. 17A to 17C are sectional views of an SRAM according to the embodiment II, in which;

FIG. 17A is a sectional view of a bipolar transistor constituting a peripheral circuit;

FIG. 17B is a sectional view of the same portion of a memory cell as that shown in FIG. 3; and FIG. 17C is a sectional view of the same portion of the memory cell as that shown in FIG. 4.

FIGS. 19A to 22B are sectional views showing the steps manufacturing an SRAM according to the embodiment III;

FIGS. 23 to 25 are plan or sectional views showing the arrangement of an SRAM according to the embodiment IV;

FIGS. 28A to 30C are fragmentary sectional views showing the steps of manufacturing a modification of the embodiment I.

DESCRIPTION OF THE PREFERRED EMBODIMENTS

The present invention will be described hereinunder with reference to the accompanying drawings.

Embodiment I

Figure 1:
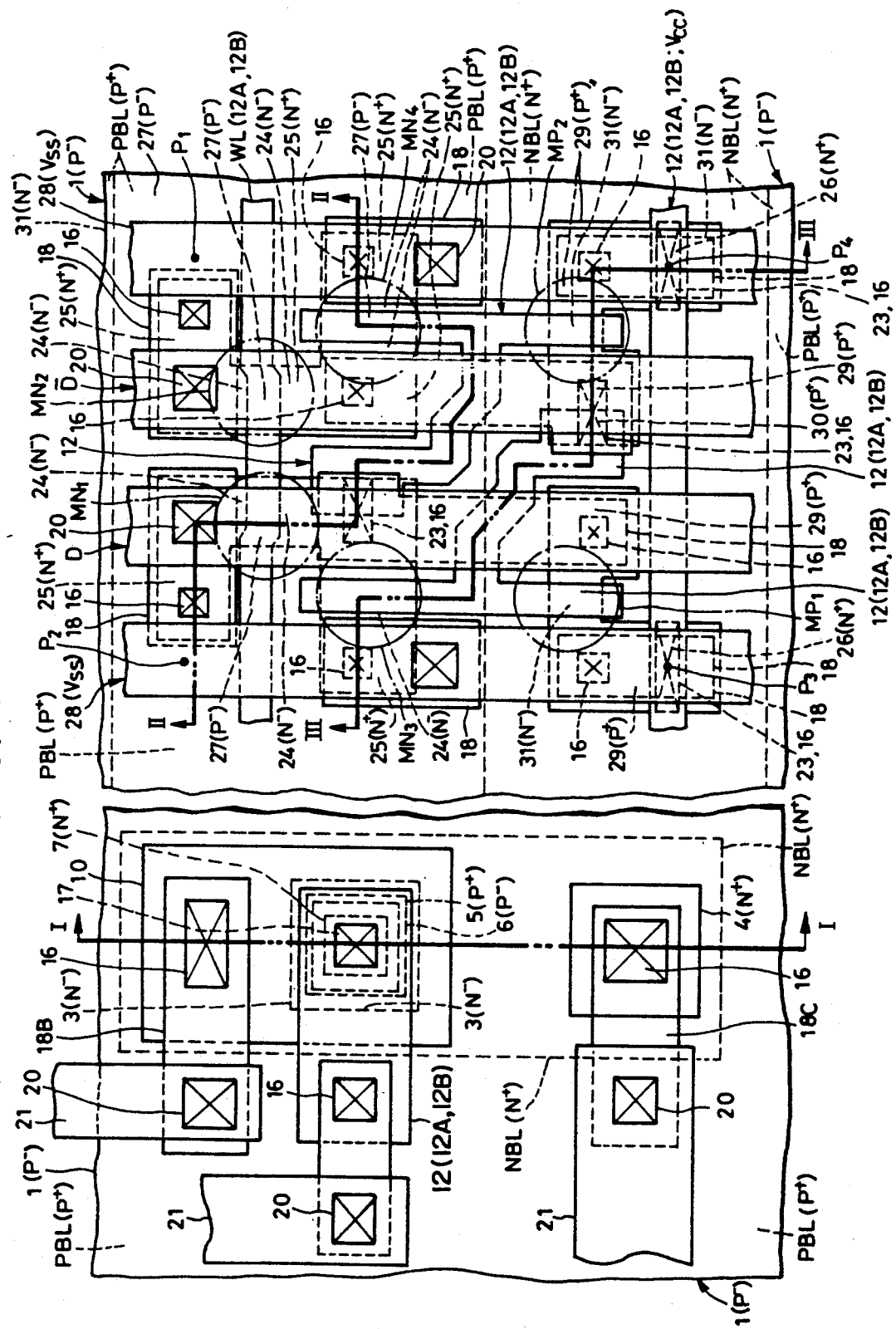
FIG. 1 is a plan view showing a bipolar transistor constituting a peripheral circuit of an SRAM and MISFETs constituting a memory cell.

FIG. 1 is a plan view of a part of a static type random access memory (hereinafter referred to as "SRAM") to which the present invention is applied, in which: the left-hand part is a plan view of a bipolar transistor constituting a peripheral circuit; and the right-hand part is a plan view of two P-channel MISFETs and four N-channel MISFETs, which constitute in combination one memory cell.

Figure 2:
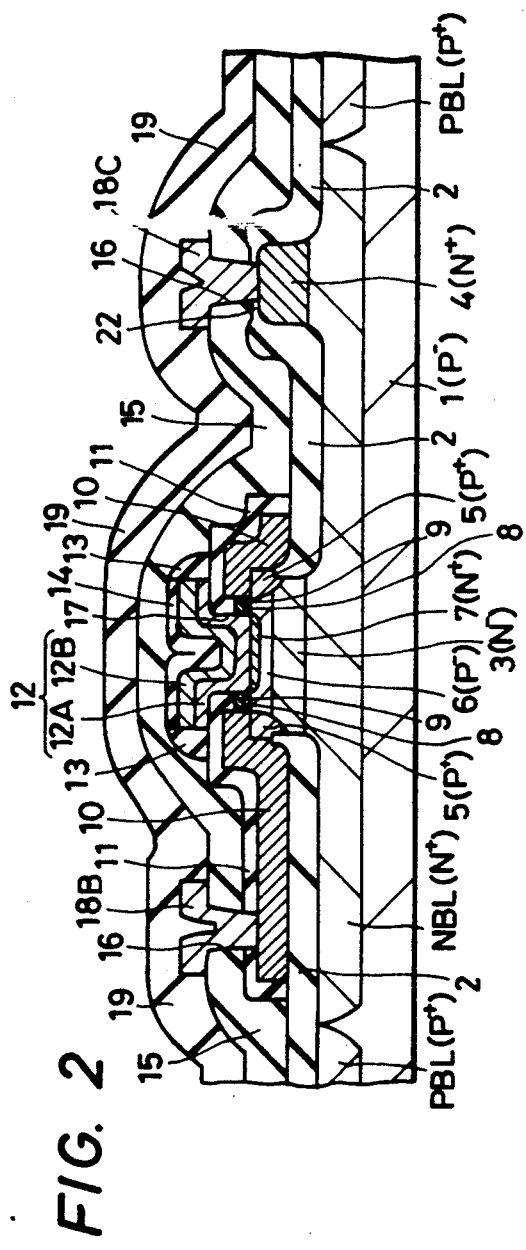
FIG. 2 is a sectional view taken along the line I—I of FIG. 1.
Figure 3:
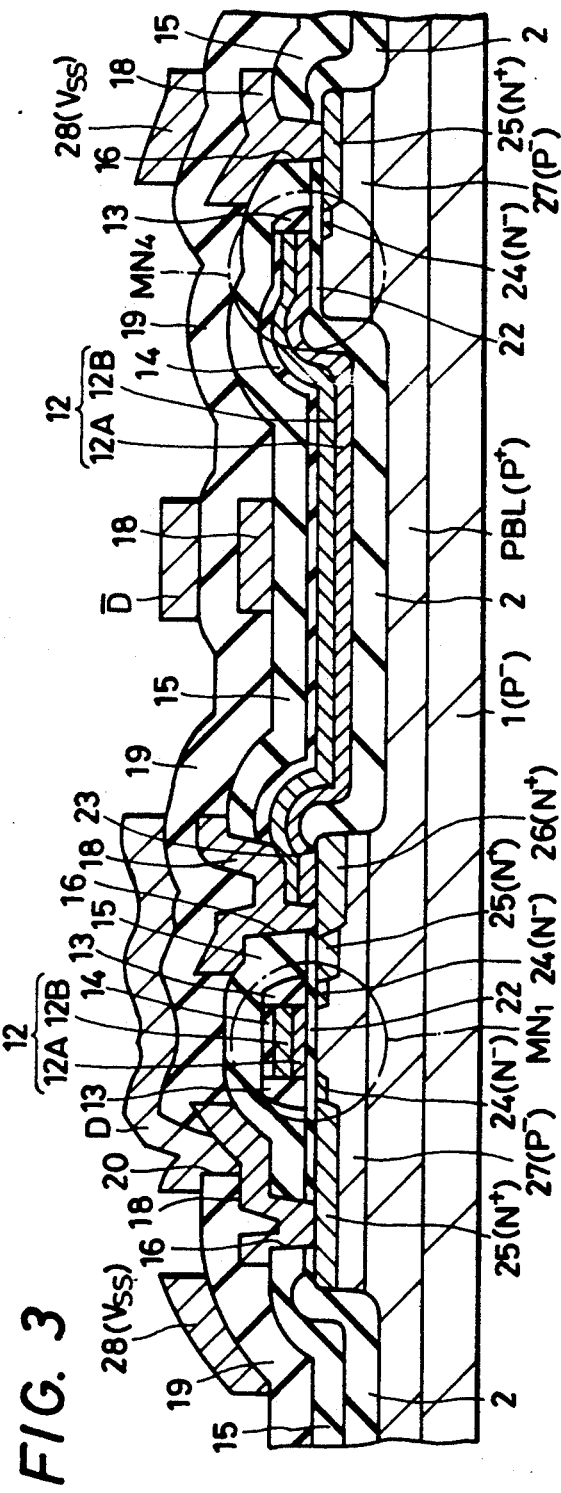
FIG. 3 is a sectional view taken along the line II—II of FIG. 1.
Figure 4:
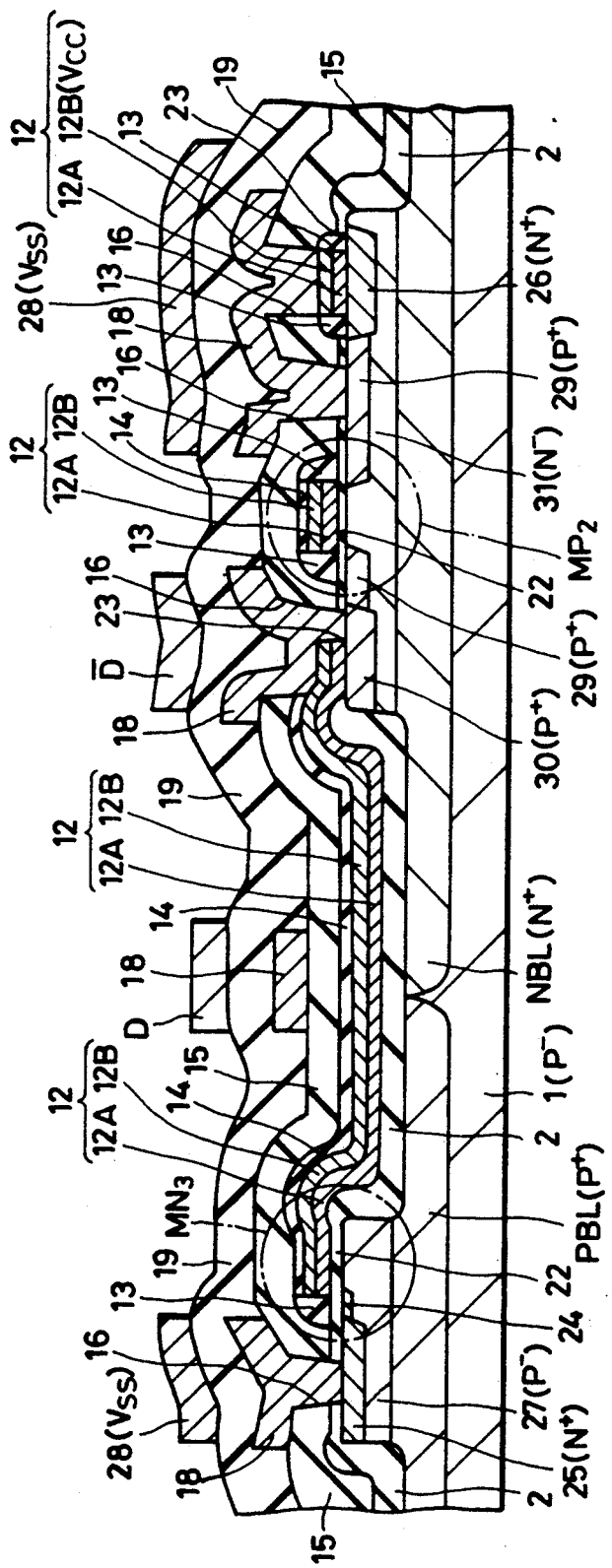
FIG. 4 is a sectional view taken along the line III-—III of FIG. 1.

FIG. 2 is a sectional view taken along the line I—I in the left-hand part of FIG. 1;

FIG. 3 is a sectional view taken along the line II—II in the right-hand part of FIG. 1; and FIG. 4 is a sectional view taken along the line III-—III in the right-hand part of FIG. 1.

It should be noted that no insulating films such as a field insulating film, interlayer insulating film and the like are shown in FIG. 1 with a view to facilitating understanding of the arrangement of the elements.

The arrangement of the bipolar transistor will first be explained.

Referring to the left-hand part of FIG. 1 and FIG. 2, the reference numeral 1 denotes a substrate of $P^-$-type single crystal silicon, and an $N^+$-type buried layer NBL and a $P^+$-type buried layer PBL are formed on the surface of the substrate 1. The bipolar transistor comprises the buried layer NBL, an $N^-$-type collector region 3, an $N^+$-type collector lead-out region 4, a $P^-$-type intrinsic base region 6, a $P^+$-type semiconductor region (graft base region) 5 serving as a region for leading out the intrinsic base region 6, and an $N^+$-type emitter region 7. The collector region 3, the intrinsic base region 6, the $P^+$-type semiconductor region 5, i.e., the extreme base region, the emitter region 7 and the collector lead-out region 4 are formed in an epitaxial layer grown on the substrate 1. The periphery of the $N^+$-type buried layer NBL is surrounded by the $P^+$-type buried layer PBL, thereby isolating this bipolar transistor from other bipolar transistors (not shown).

As shown in FIG. 2, the $N^-$-collector region 3, the $P^+$-type semiconductor region 5, the $P^-$-type intrinsic base region 6 and the $N^-$-type emitter region 7 are formed within the same projecting protruding region on the buried layer NBL, that is, on the substrate 1, while the $N^+$-type collector lead-out region 4 is formed in a projecting or protruding region which is different from the first projecting region. These two projecting regions are isolated from each other by a field insulating film 2 defined by a silicon oxide film which covers the surface of the substrate 1, that is, the respective surfaces of the buried layers NBL, PBL, a part of the side surface of the first projecting region in which are provided the collector region 3, the $P^+$-type semiconductor region 5, the intrinsic base region 6 and the emitter region 7, and the whole of the side surface of the second projecting region in which the collector lead-out region 4 is provided. A part of the $P^+$-type semiconductor region 5 is not covered with the field insulating film 2, and a base electrode 10 defined by a polycrystalline silicon film is self-alignedly connected to the exposed portion of the $P^+$-type semiconductor region 5. The exposed surface of the base electrode 10 is covered with an insulating film 11 defined by a silicon oxide film obtained by thermal oxidation of the surface of the base electrode (polycrystalline silicon film) 10. It should be noted that an $SiO_2$ film 8 and an $Si_3N_4$ film 9 which are formed on a part of the upper surface of the intrinsic base region 6 are the remainders of the masks employed to form the field insulating film 2 and the insulating film 11. The reference numeral 12 denotes an emitter electrode which is defined by a two-layer film comprising a polycrystalline silicon film 12A and a film 12B of a refractory metal, for example, W, Mo, Ta, Ti, Pt or the like, or a film 12B of a silicide of such a refractory metal, which is stacked on the film 12A. The emitter electrode 12 is connected to the emitter region 7 through a contact hole 17 defined by the insulating films 8, 9 and 11. A side wall 13 defined by an $SiO_2$ film is formed on the side surface of the emitter electrode 12. The side wall 13 is formed in the same manufacturing step as that for forming a side wall provided on the side surface of the gate electrode of each of the MISFETs (described later). The whole surface of the substrate 1 is covered with an insulating film 15 formed by stacking a phosphor-silicate-glass (PSG) film on a silicon oxide film by way of example. Interconnections 18B and 18C which are defined by a first-level aluminum film are connected to the base electrode 10 and the $N^+$-collector lead-out region 4 through contact holes 16, respectively. An insulating film 19 formed by stacking a spin-on-glass (SOG) film on a silicon oxide film and further stacking a PSG film thereon is provided on the insulating film 15. Predetermined portions of the insulating film 19 are removed to define contact holes 20 (see FIG. 1), through which interconnections 21 defined by a second-level aluminum film are connected to the emitter electrode 12 (12A, 12B) and the interconnections 18B 18C, respectively.

The following is a description of the arrangement of the memory cell shown in the right-hand part of FIG. 1 and FIGS. 3, 4.

Figure 18:
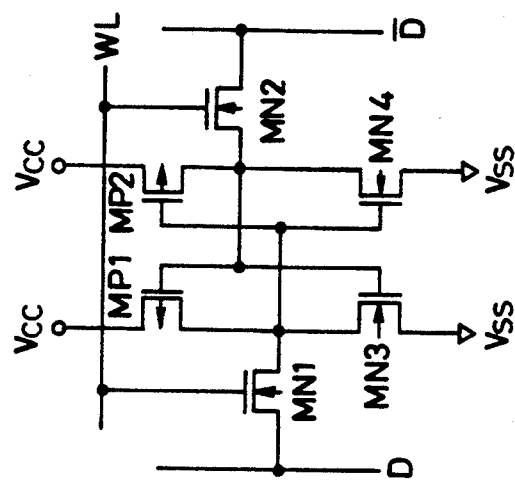
FIG. 18 is an equivalent circuit of a memory cell of an SRAM.

Each of the memory cells in this embodiment comprises complementary MISFETs, that is, P-channel MISFETs and N-channel MISFETs. An equivalent circuit of the memory cell is shown in FIG. 18.

Referring to FIGS. 1, 3 and 4, one memory cell region is defined by the region within the four points $P_1P_2$, $P_3$ and $P_4$. The P-channel MISFETs $MP_1$, $MP_2$ and N-channel MISFETs $MN_1$, $MN_2$, $MN_3$, $MN_4$, which constitute in combination one memory cell, are shown by the respective one-dot chain line circles.

Each of N-channel MISFETs $MN_1$, $MN_2$, $MN_3$, $MN_4$ is formed on the principal surface of a $P^-$-well region 27 provided on the $P^+$-type buried layer PBL. On the other hand, each of the P-channel MISFETs $MP_1$, $MP_2$ is formed on the principal surface of an $N^-$-well region 31 provided on the $N^+$-type buried layer NBL. Each of the N-channel MISFETs $MN_1$, $MN_2$, $MN_3$, $MN_4$ comprises a gate insulating film 22 defined by a silicon oxide film formed by thermal oxidation of the surface of the $P^-$-well region 27, a gate electrode 12 formed by stacking on a polycrystalline silicon film 12A a film 12B of a refractory metal, for example, W, Mo, Ta, Ti, Pt or the like, or a film 12B of a silicide of such a refractory metal, and $N^-$- and $N^+$-type semiconductor regions 24, 25 constituting in combination each of the source and drain regions. The gate electrode 12 is defined by the same layer as that for the emitter electrode 12 of the bipolar transistor. The distance between the gate electrode 12 and the $N^+$-type semiconductor region 25 is regulated by a side wall 13 defined by a silicon oxide film. The polycrystalline silicon film 12A of the gate electrode 12 of each of N-channel MISFETs $MN_1$, $MN_2$, $MN_3$, $MN_4$ has an N-type impurity (e.g., phosphorus or arsenic) introduced thereinto so as to be of the N type. The gate electrodes 12 of the N-channel MISFETs $MN_1$, $MN_2$ are formed integrally with a word line WL extending on the field insulating film 2. An $N^+$-type semiconductor region 26 is provided in the vicinity of the MISFET $MN_1$ and electrically connected to the $N^+$-type semiconductor region 25. The $N^+$-type semiconductor region 26 is formed by diffusing into the well region 27 the N-type impurity contained in the polycrystalline silicon film 12A of the gate electrode 12 of the MISFET $MN_4$ which is extended on the field insulating film 2. An opening 23 is provided above the $N^+$-type semiconductor region 26, and the gate electrode 12 of MISFET $MN_4$ is electrically connected to the region 26 through this opening 23. The upper surface of the gate electrode 12 is covered with an insulating film 14 defined by a silicon oxide film.

The $P^-$-well region 27 in which is provided each of the N-channel MISFETs $MN_1$, $MN_2$, $MN_3$, $MN_4$ projects from the surface of the $P^+$-type buried layer PBL (i.e., the surface of the substrate 1) in the same way as in the case of the collector region 3, $P^+$-type semiconductor region 5, intrinsic base region 6, emitter region 7 and collector lead-out region 4 of the bipolar transistor.

Each of the P-channel MISFETs $MP_1$, $MP_2$ is formed on the principal surface of an $N^-$-well region 31 provided on the surface of the $N^+$-type buried layer NBL, that is, the surface of the substrate 1, and comprises a gate insulating film 22 defined by a silicon oxide film formed by thermal oxidation of the surface of the $N^-$-well region 31, a gate electrode 12 formed by stacking on a polycrystalline silicon film 12A, a film 12B of a refractory metal or a refractory metal silicide, and $P^+$-type semiconductor regions 29 constituting source and drain regions. The gate electrode 12 of each of the P-channel MISFETs $MP_1$, $MP_2$ has a P-type impurity, e.g., boron (B), introduced thereinto so as to be of the P-type. An opening 23 is provided in the vicinity of the P-channel MISFET $MP_2$, and the gate electrode 12 extending from the N-channel MISFET $MN_3$ is connected to the well region 31 through this opening 23. That portion of the surface of the well region 31 corresponding to MISFET $MP_2(MP_1)$ which is connected with the gate electrode 12 MISFET $MN_3(MN_4)$ is formed into a $P^+$-type semiconductor region 30 by diffusion of a P-type impurity, e.g., boron (B), contained in the polycrystalline silicon film 12A.

The $N^-$-well region 31 in which each P-channel MISFET is formed projects (protrudes) from the surface of the $N^+$-type buried layer NBL (i.e., the surface of the substrate 1) in the same way as in the case of the $P^-$-well region 27 in which is formed each of the N-channel MISFETs $MN_1$, $MN_2$, $MN_3$, $MN_4$.

As shown in FIG. 1, the $N^+$-buried layer NBL and the $P^+$-buried layer PBL in the memory cell region extend in a parallel direction with respect to the word line WL (i.e., in a direction which intersects data lines D and $\overline{D}$). Further, the $N^+$-buried layer NBL and the $P^+$-buried layer PBL are alternately disposed in the direction in which the data lines D and $\overline{D}$ extend. The N-channel MISFETs $MN_1$ and $MN_3$ are formed in the same $P^-$-well region 27, while the N-channel MISFETs $MN_2$ and $MN_4$ are formed in the same $P^-$-well region 27. On the other hand, the P-channel MISFETs MP$_1$, MP$_2$ are formed in the respective N$^-$-well regions 31. These four well regions 27 and 31 are isolated from each other by the field insulating film 2, the N$^+$-buried layer NBL and the P$^+$-buried layer PBL. In other words, the MISFETs are isolated from each other in the same way as in the isolation effected between the bipolar transistors. An interconnection 12 which is defined by the same layer as that for the word line WL, the gate electrode 12 and the emitter electrode 12 is connected to each N$^-$-well region 31 through the corresponding opening 23, and a power supply voltage Vcc (e.g., 5 V) is applied thereto through this interconnection 12. In other words, the power supply voltage Vcc is applied within the memory cell. The polycrystalline silicon film 12A of the interconnection 12 has an N-type impurity, e.g., phosphorus or arsenic, introduced thereinto so as to be of the N-type. An N$^+$type semiconductor region 26 is formed in that portion of the surface of the well region 31 which is connected with the interconnection 12 by diffusion of the N-type impurity contained in the polycrystalline silicon film 12A. The P$^-$-well regions 27 are fed by applying a ground potential Vss (e.g., 0 V) of the circuit to the P$^+$-buried layer PBL from a second-level aluminum interconnection (not shown) which is provided every predetermined number of memory cells, e.g., 4, 8 or 16 cells, such as to extend in the same direction as the data lines D and $\bar{E}$. The second-level interconnections for applying the ground potential Vss are connected together between memory cells. A P$^-$-well region 27 which is isolated from other P$^-$-well regions 27 is provided on that portion of the P$^+$-buried layer PBL to which is connected the interconnection for the ground potential Vss, so that the ground potential Vss is fed to the P$^+$-buried layer PBL through this P$^-$-well region 27 and further fed to the P$^-$-well regions 27 in which the P-channel MISFETs MP$_1$ and MP$_2$ are formed, respectively. A P$^+$-type semiconductor region is formed in that portion of the surface of the P$^-$-well region 27 to which is connected the aluminum interconnection for feeding the ground potential Vss, in the same manufacturing step as that for the source and drain regions (P$^+$-type semiconductor regions 29) of the P-channel MISFETs MP$_1$ and MP$_2$.

The reference numerals 18 denote first-level aluminum interconnections which are respectively connected through contact holes 16 to the upper surfaces of the gate electrodes 12 and the upper surfaces of the N$^+$- and P$^+$-type semiconductor regions 25, 29 which define the source and drain regions. The data lines D and $\bar{D}$ are defined by the second-level aluminum film and connected to the interconnections 18 provided on the respective first N$^+$-semiconductor regions 25 of the N-channel MISFETs MN$_1$ and MN$_2$ through respective contact holes 20 formed by partially removing the insulating film 19. The N$^+$-type semiconductor region 25 which constitutes a part of the source region of each of the N-channel MISFETs MN$_3$ and MN$_4$ is connected with a ground potential interconnection 28 defined by the second-level aluminum film through the corresponding contact hole 20, aluminum wiring 18 and contact hole 16.

As described above, according to this embodiment, the N$^-$-well region 31 in which is formed each of the N-channel MISFETs MN$_1$, MN$_2$, MN$_3$, MN$_4$ and the P$^-$-well region 27 in which is formed each of the P-channel MISFETs MP$_1$, MP$_2$ are designed to have a structure which is similar to that of the projecting or protruding region in which are formed the collector region 3, intrinsic base region 6, P$^+$-type semiconductor region 5 and emitter region 7 of each bipolar transistor and the structure of the projecting or protruding region in which the collector lead-out region 4 is formed. Thus, it is possible to isolate the MISFETs from each other by means of the field insulating film 2 and the P-N junction between the N$^+$-buried layer NBL and P$^+$-buried layer PBL in the same way as in the isolation effected between the bipolar transistors.

The manufacturing process according to the present invention will next be described.

FIGS. 5A to 16C are plan or sectional views showing the steps in the process for manufacturing a semiconductor integrated circuit device according to the present invention. It should be noted that each of the numbers of these figures consists of an Arabic numeral and a letter in the alphabet, e.g., FIGS. 5A, 5B and 5C, and each Arabic numeral denotes the same section or sectional views in the same step, while the letter A denotes the same section as that shown in FIG. 2, B the same section as that shown in FIG. 3, and C the same section as that shown in FIG. 4.

Figure 5A:
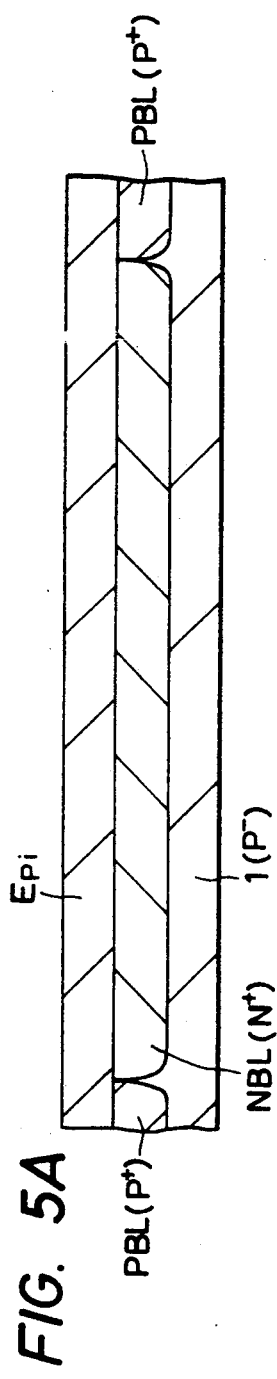
Figure 5B:
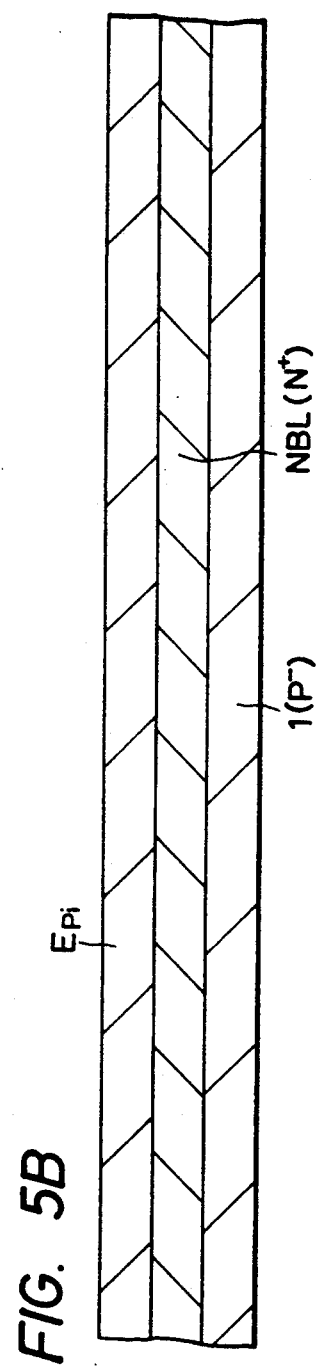
Figure 5C:
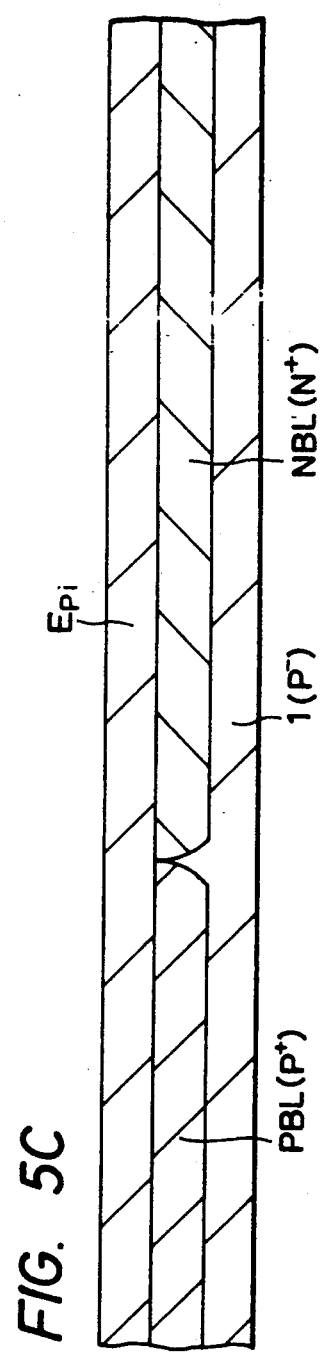

As shown in FIGS. 5A, 5B an 5C, an N$^+$-buried layer NBL and a P$^+$-type buried layer PBL are formed on the surface of a P$^-$-type single crystal silicon substrate 1 by introducing an N-type impurity [e.g., antimony (Sb) or phosphorus (P)] and a P-type impurity [e.g., boron (B)], respectively, by means, for example, of ion implantation. Thereafter, an epitaxial layer Epi is grown.

Figure 6A:
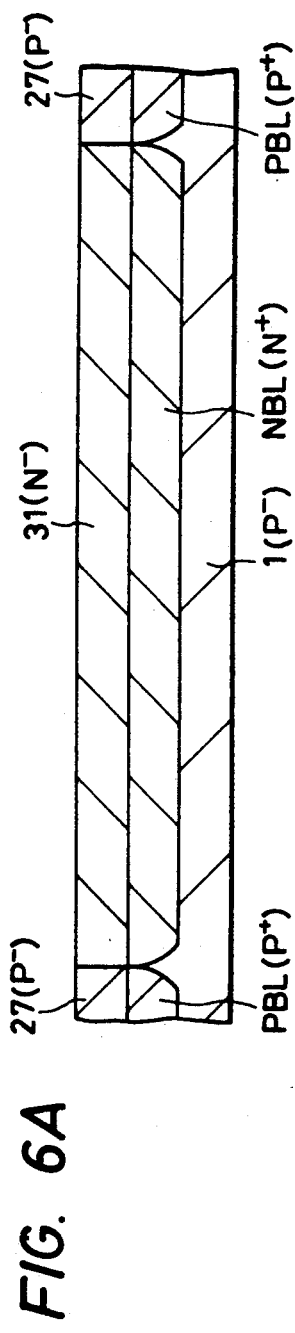
Figure 6B:
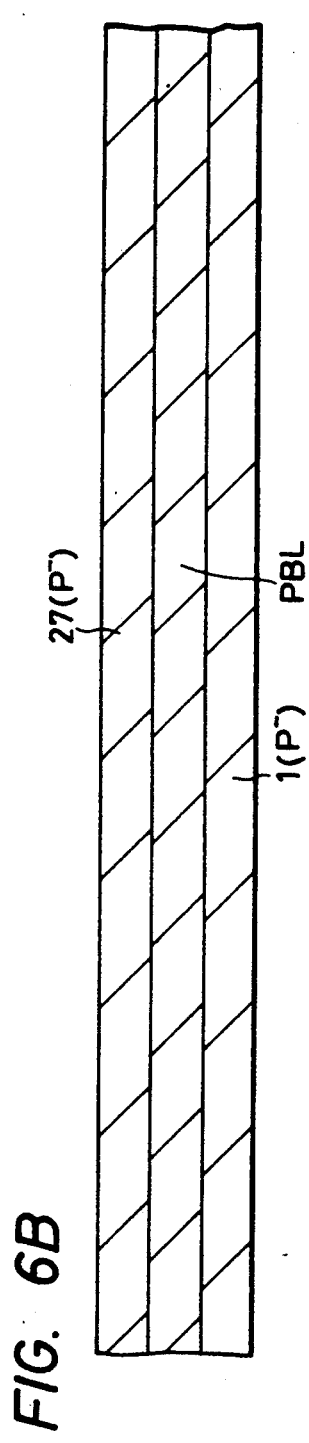
Figure 6C:
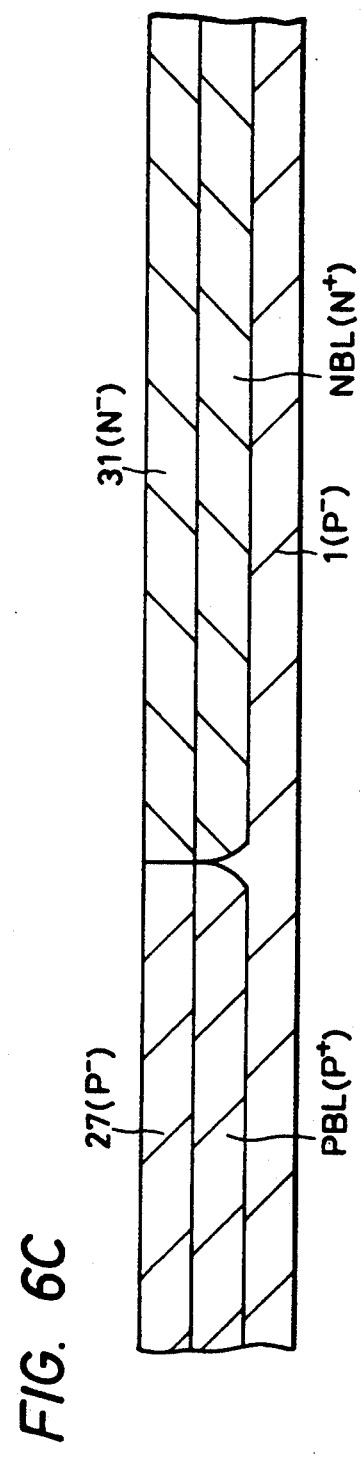
Figure 7:
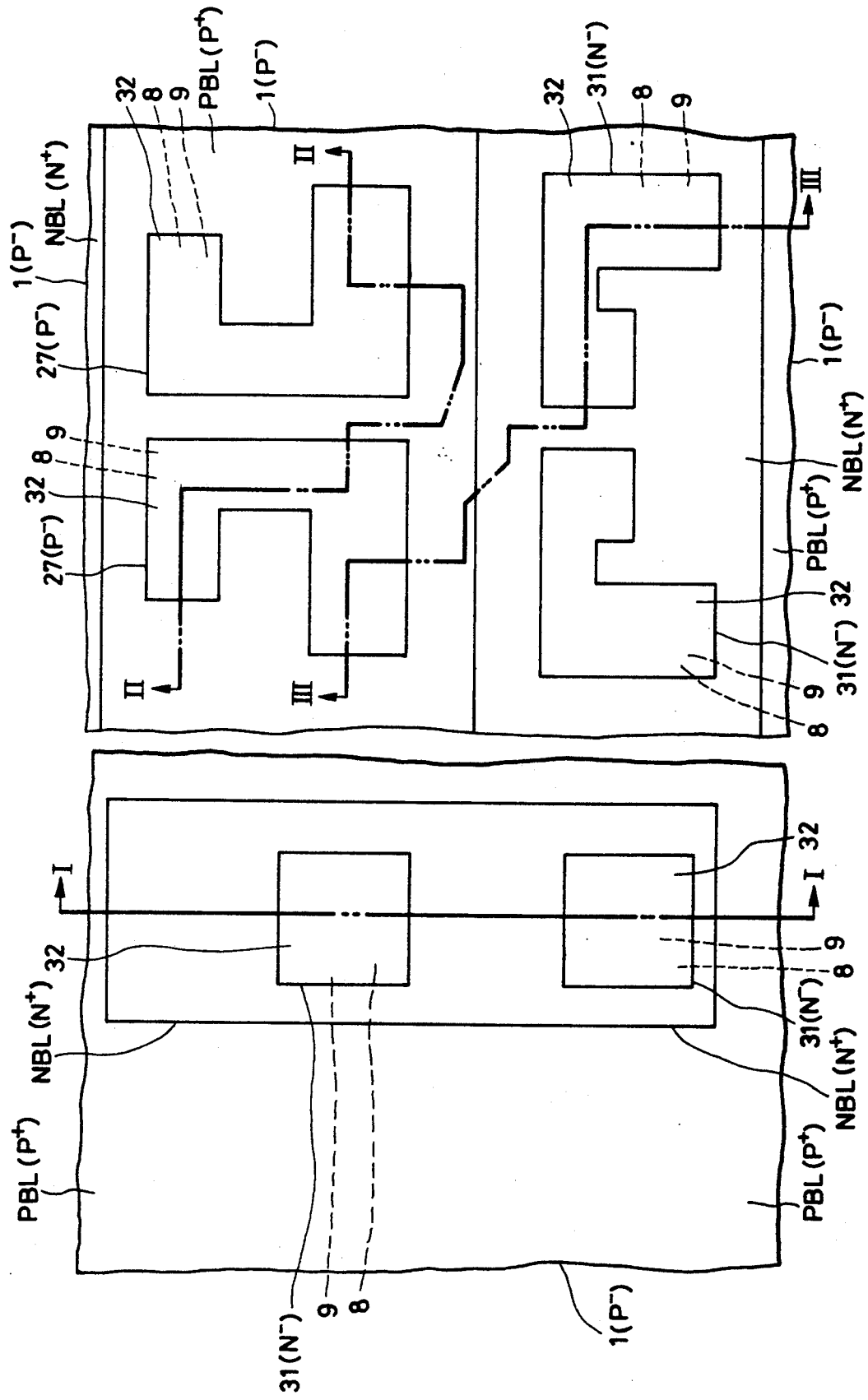
Figure 8A:
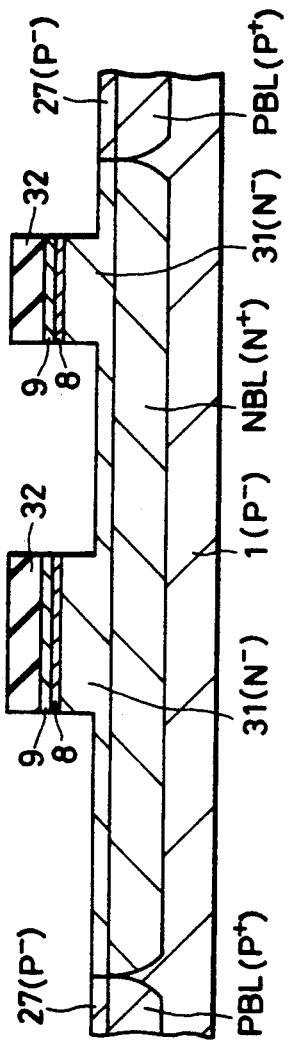
Figure 8B:
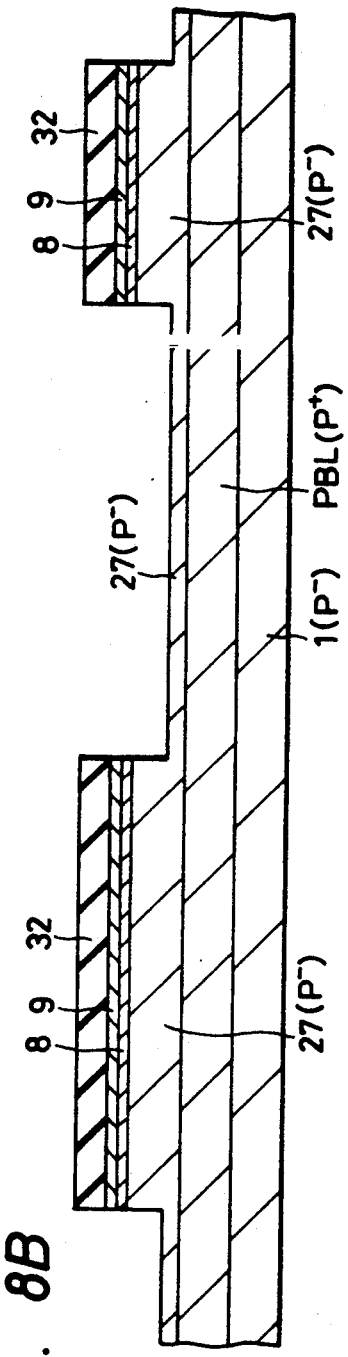
Figure 8C:
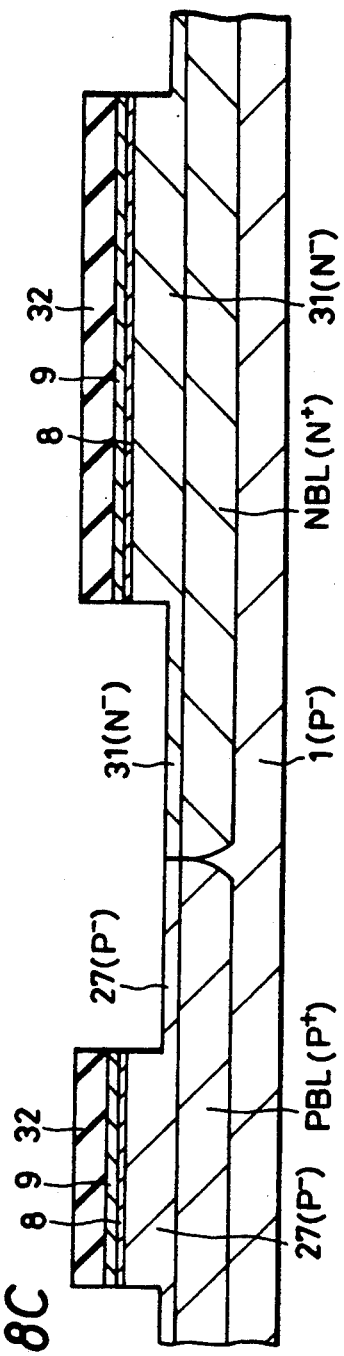
Figure 10:
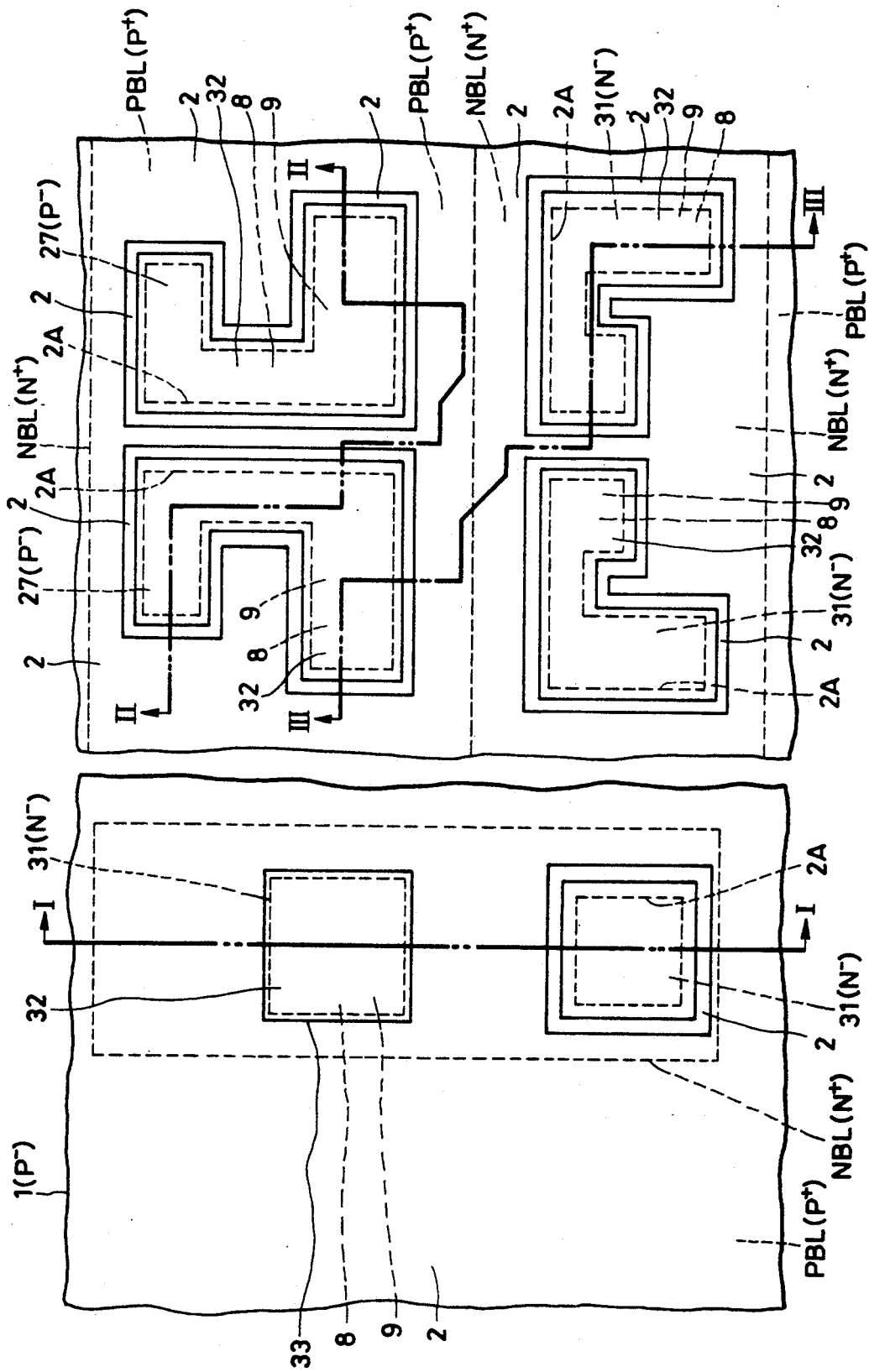

Next, as shown in FIGS. 6A, 6B and 6C, N$^-$-well regions 31 and P$^-$-well regions 27 are formed in the epitaxial layer Epi by introducing an N-type impurity [e.g., antimony (Sb) or phosphorus (P)] and a P-type impurity [e.g., boron (B)], respectively, by means, for example, of ion implantation employing a mask defined by a resist film by way of example.

Next, as shown in FIGS. 7, 8A, 8B and 8C, the whole surfaces of the well regions 27 and 31 are subjected to thermal oxidation to form a silicon oxide film 8, and a silicon nitride film 9 and a silicon oxide film 32 are successively formed on the film 8 by, for example, CVD. The silicon oxide film 32, the silicon nitride film 9 and the silicon oxide film 8 are etched by, for example, reactive ion etching (RIE) employing a mask (not shown) defined by a resist film so that the stack of said films is left in predetermined patterns, that is, patterns of the following regions: a projecting or protruding region (first region) in which are provided the collector region 3, P$^+$-semiconductor region 5, intrinsic base region 6 and emitter region 7 of each bipolar transistor; a projecting or protruding region (second region) in which is provided the collector lead-out region 4 of the bipolar transistor; and a projecting or protruding region (third region) in which is provided each of the N- and P-channel MISFETs MN$_1$, MN$_2$, MN$_3$, MN$_4$, MP$_1$ and MP$_2$. The projecting regions may also be formed by employing a wet etching in place of RIE. After this etching, the mask defined by a resist film is removed. Next, that portion of the surface of each of the P$^-$- and N$^-$-well regions 27 and 31 which is not covered with the corresponding stack of the silicon oxide film 32, the silicon nitride film 9 and the silicon oxide film 8 is etched to a predetermined depth by RIE so that portion of said surface which is covered with the stack of the films 32, 9 and 8 projects or protrudes from the surface of the substrate. Said predetermined depth is such a depth that, when the field insulating film 2 is formed later, the bottom of the film 2 reaches the buried layers NBL and PBL.

Next, as shown in FIGS. 9A, 9B and 9C, a silicon nitride film 33 is formed by, for example, CVD, so that the whole surfaces of the well regions 27 and 31 are covered with the film 33, and then this silicon nitride film 33 is etched by RIE until the upper surfaces of the well regions 27 and 31 are exposed, thereby forming a side wall defined by the silicon nitride film 33 (hereinafter referred to as the "side wall 33") on the side surface of the stack of the silicon oxide film 8, the silicon nitride film 9 and the silicon oxide film 32 in each of the projecting well regions 27 and 31.

Next, as shown in FIGS. 10, 11A, 11B and 11C, the projecting region in which are formed the collector region 3, P+-semiconductor region 5, intrinsic base region 6 and emitter region 7 of the bipolar transistor is covered with a mask defined by a resist film, and the side walls 33 which are not covered with this mask are then removed. The mask defined by a resist film is removed after the selective removal of the side walls 33. Next, the surface of each P--well region 27 which is not covered with the stack of the silicon oxide film 32, the silicon nitride film 9 and the silicon oxide film 8 and the surface of each N--well region 31 which is not covered with the side wall 33 nor the stack of the silicon oxide film 32, the silicon nitride film 9 and the silicon oxide film 8 are subjected to thermal oxidation to form a field insulating film 2 which is defined by a silicon oxide film. Since the bottom of the field insulating film 2 reaches the buried layers NBL and PBL, the projecting portion which has its upper surface covered with the stack of the silicon oxide film 32, the silicon nitride film 9 and the silicon oxide film 8 is left alone in each of the P-- and N--well regions 27 and 31.

The configuration of the field insulating film 2 for the N- and P-channel MISFETs $MN_1$, $MN_2$, $MN_3$, $MN_4$, $MP_1$ and $MP_2$ is the same as that of the field insulating film 2 at the projecting region in which is formed the collector lead-out region 4 of the bipolar transistor. Thus, isolation between the MISFETs and between these MISFETs and the bipolar transistors is carried out in the same manufacturing step as that for the isolation between the bipolar transistors. It should be noted that the reference numeral 2A in FIG. 10 denotes "bird's beaks" of the field insulating film 2.

After the formation of the field insulating film 2, a mask defined by a resist film having a pattern which leaves the side wall 33 exposed is formed on the buried layers NBL and PBL, and the side wall 33 is removed by etching. During this etching, the side surface of the silicon nitride film 9 which is not covered with this resist mask, that is, the silicon nitride film 9 on the projecting region in which are formed the collector region 3, the P+-type semiconductor region 5, the intrinsic base region 6 and the emitter region 7, and the film 9 is thus recessed. After the removal of the side wall 33, the resist mask employed in the etching is removed.

Figure 12A:
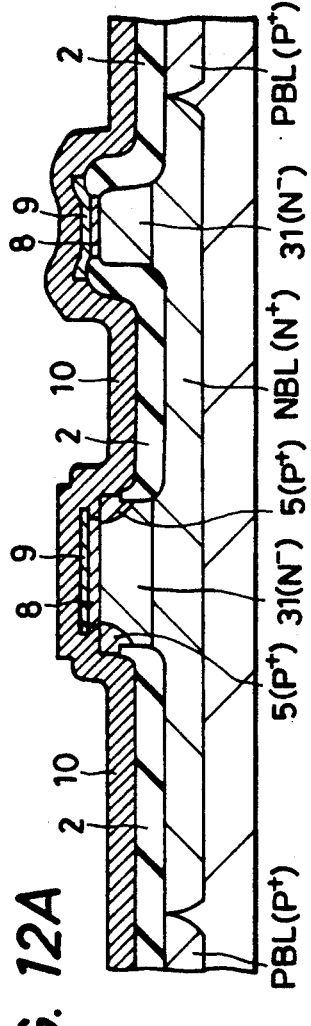
Figure 12B:
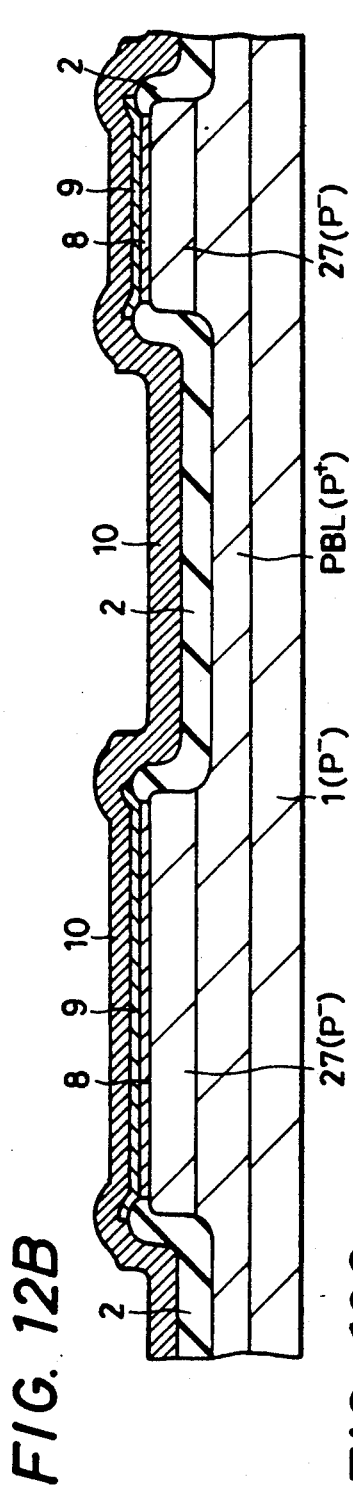
Figure 12C:
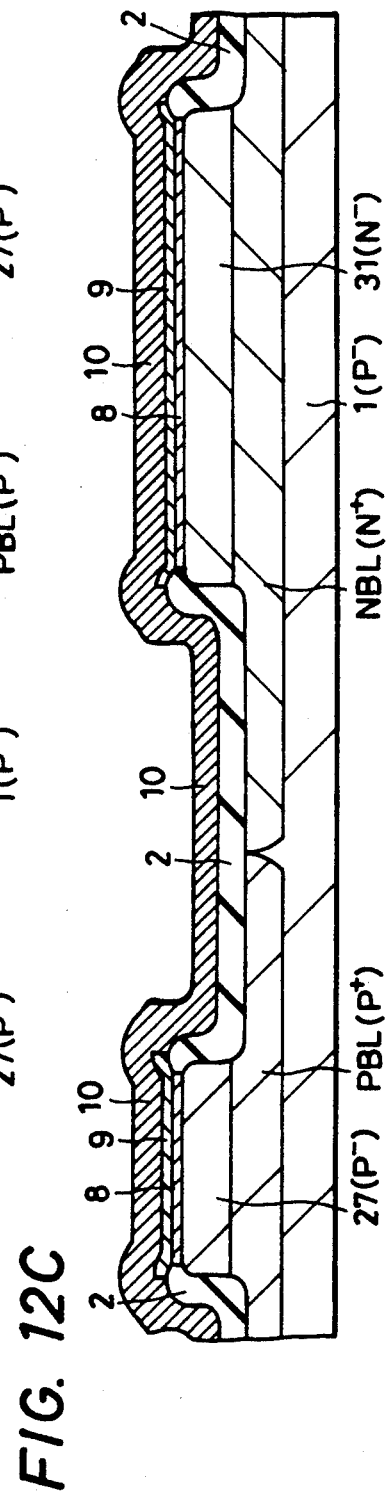
Figure 13:
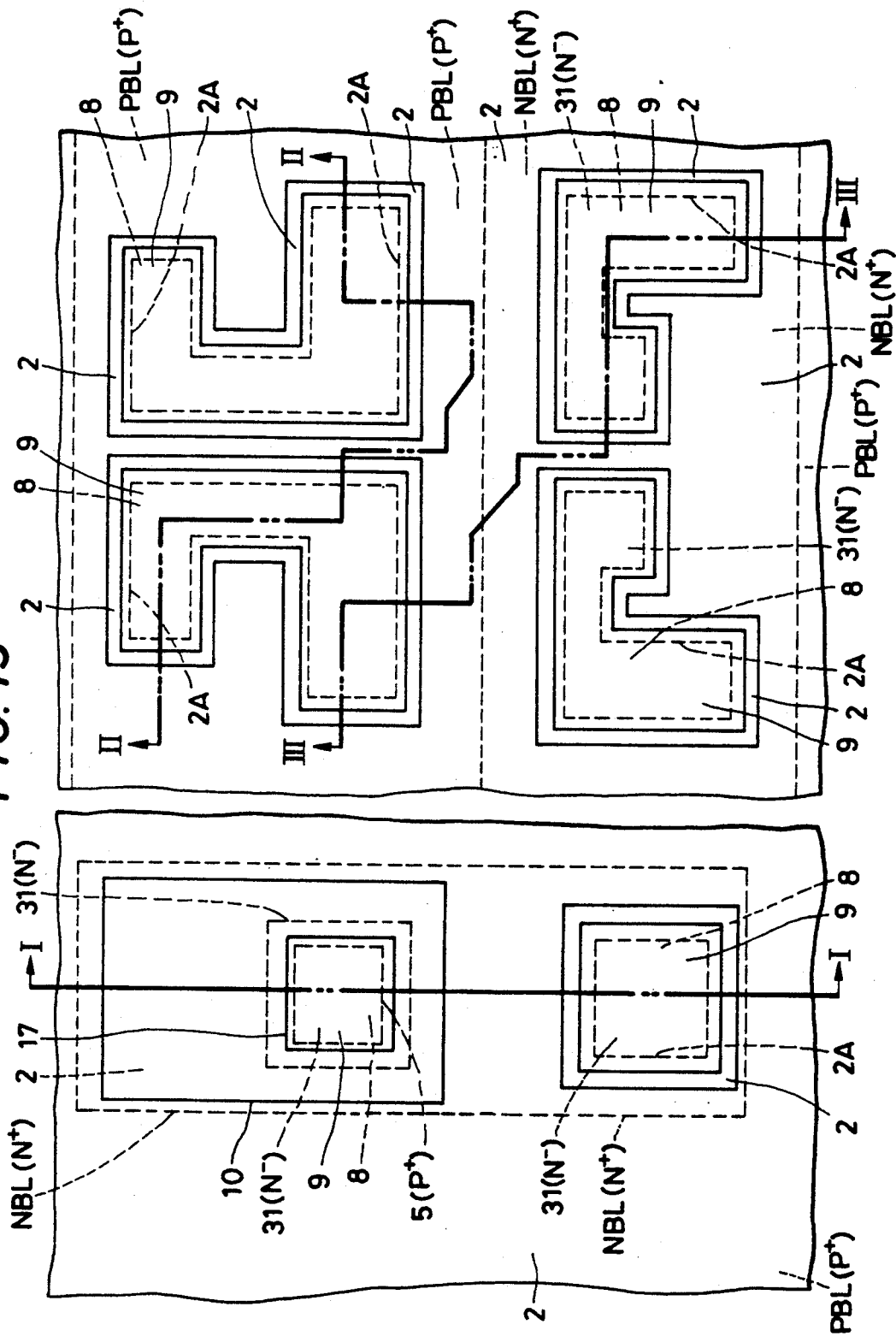
Figure 16A:
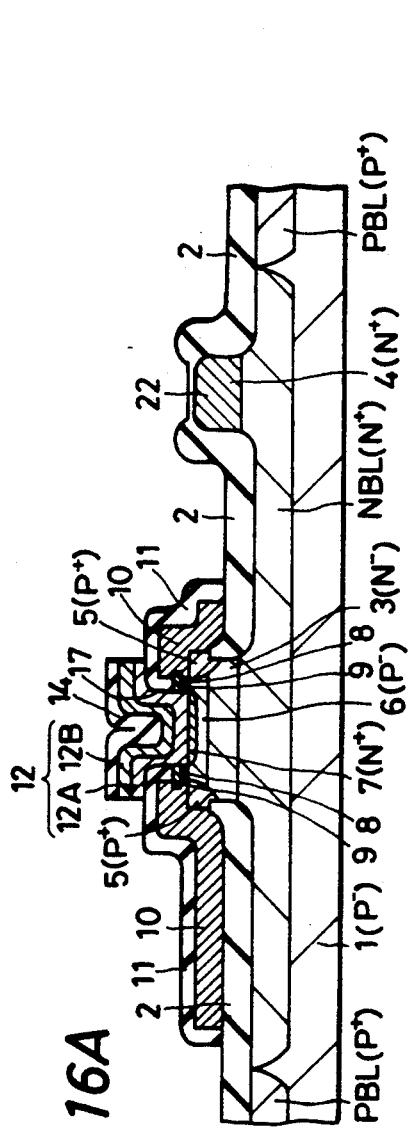
Figure 16B:
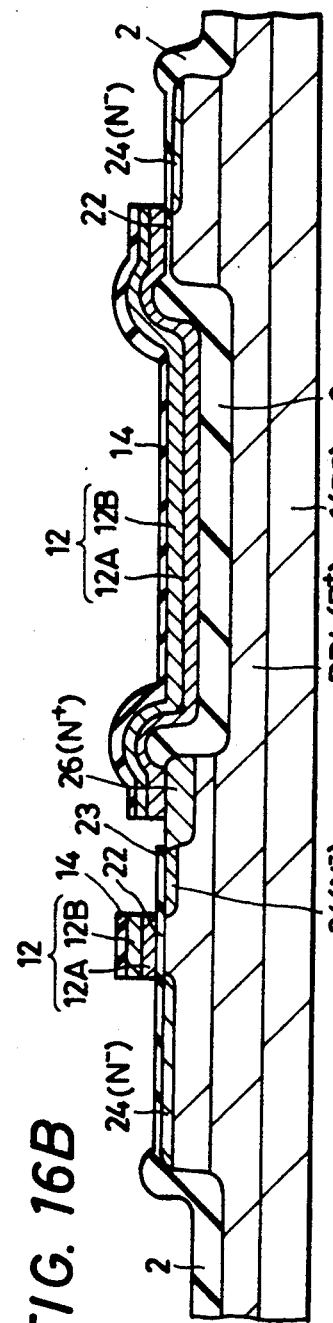
Figure 16C:
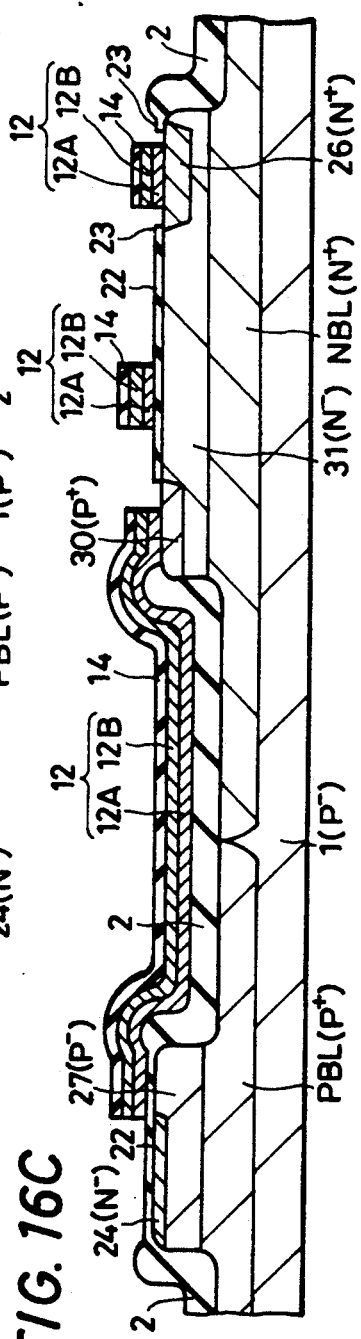

Next, as shown in FIGS. 12A, 12B and 12C, the silicon oxide films 32 are first removed, and etching is then carried out using a mask defined by a resist film having a pattern which exposes the projecting region in which are formed the collector region 3, the P+-type semiconductor region 5, the intrinsic base region 6 and the emitter region 7 to thereby recess the side surface of the silicon oxide film 8 which is not covered with this mask. Thereafter, the resist mask is removed. Next, a polycrystalline silicon film 10 is formed on the whole surfaces of the buried layers NBL and PBL by, for example, CVD. Next, a P-type impurity, for example boron (B), is introduced into the polycrystalline silicon film 10 by, for example, ion implantation, and then annealing is conducted. At this time, the P-type impurity in the polycrystalline silicon film 10 is introduced into the side surface of the N--well region 31 on which film 10 is deposited to form a P+-semiconductor region 5.

Next, as shown in FIGS. 13, 14A, 14B and 14C, the polycrystalline silicon film 10 is patterned by etching using a mask defined by a resist film to form a base region electrode 10. Next, the exposed surface of the base electrode 10 is subjected to thermal oxidation to form an insulating film 11 defined by a silicon oxide film. The silicon nitride film 9 serves as a mask to the thermal oxidation.

Next, as shown in FIGS. 15, 16A, 16B and 16C, the exposed silicon nitride films 9 are removed by etching, and then the silicon oxide films 8 are removed by etching. The exposed upper surfaces of the P-- and N--well regions 27 and 31 are subjected to thermal oxidation to form gate insulating films 22 which are defined by silicon oxide films. Next, a P--intrinsic base region 6, and N+-emitter region 7 and an N+-collector lead-out region 4 are successively formed by ion implantation using a mask which is defined by a resist film. Next, the gate insulating films 22 are selectively removed to expose the emitter region 7 and provide openings 23 by etching using a mask which is defined by a resist film. After the etching, the resist mask is removed. Next, a polycrystalline silicon film 12A is formed on the whole surfaces of the buried layers PBL and NBL by, for example, CVD. An N-type impurity, for example, phosphorus or arsenic, is introduced by, for example, ion implantation, into that portion of the polycrystalline silicon film 12A which extends over the P+-buried layer PBL and into that portion of the film 12A which is present on the N+-buried layer NBL and which is used as a part of the interconnection 12 for feeding the power supply voltage Vcc, while a P-type impurity is similarly introduced into the other portion of the polycrystalline silicon film 12A, to thereby lower the resistivity. During the annealing that is carried out to activate the impurities introduced into the polycrystalline silicon film 12A, the N- and P-type impurities in the polycrystalline silicon film 12A are diffused through the openings 23 to form N+- and P+-type semiconductor regions 26 and 30, respectively. It should be noted that the N+emitter region 7 may be formed at the same time as the formation of the semiconductor regions 26 and 30. Alternatively, the arrangement may be such that the N+- and P+-type semiconductor regions 26 and 30 are formed before the formation of the openings 23 by ion implantation using a mask defined by a resist film and the N+-emitter region 7 is formed by diffusion of an impurity from the polycrystalline silicon film 12A. A film of a refractory metal, e.g., W, Mo, Ta, Ti or Pt, is formed on the polycrystalline silicon film 12A by CVD or sputtering, and then annealed to form a refractory metal silicide film 12B. Further, a silicon oxide film 14 is formed on the refractory metal silicide film 12B by, for example, CVD. Next, the silicon oxide film 14, the refractory metal silicide film 12B and the polycrystalline silicon film 12A are successively etched by etching process using a mask defined by a resist film to form an emitter electrode 12, gate electrodes 12, a word line WL and an interconnection 12 for feeding the power supply voltage Vcc. Next, N−-type semiconductor regions 24 are formed by introducing an N-type impurity, for example, phosphorus, by ion implantation using a mask defined by a resist film.

After the formation of the N−-type semiconductor regions 24, the following constituent elements, which are shown in FIGS. 1 to 4, are formed: the side walls 13 defined by a silicon oxide film formed by, for example, CVD; the N+-type semiconductor region 25 serving as a part of each of the source and drain regions of each of the N-channel MISFETs $MN_1$, $MN_2$, $MN_3$, $MN_4$; P+-type semiconductor regions 29 serving as the source and drain regions of each of the P-channel MISFETs $MP_1$, $MP_2$; the insulating film 15 defined by a combination of a silicon oxide film and a PSG film formed by, for example, CVD; the contact holes 16; the interconnections 18, 18B and 18C defined by a first-level aluminum film formed by, for example, sputtering; the insulating film 19 defined by a stack of a silicon oxide film, a spin-on-glass film and a PSG film formed by, for example, CVD; the contact holes 20; and the interconnections 21, 28 and the data lines D, $\overline{D}$ which are defined by a second-level aluminum film formed by, for example, sputtering.

As has been described above, the technique of isolation between the bipolar transistors is effectively employed for isolation between the MISFETs and also between these MISFETs and the bipolar transistors by the process comprising the steps of: forming the silicon nitride film 9 (the first mask) on each of the following regions on the substrate 1, that is, the first region in which are provided the collector region 3, the P+-type semiconductor region (graft base region) 5, the intrinsic base region 6 and the emitter region 7, the second region in which the collector lead-out region 4 is provided, and the third region in which a MISFET is provided; etching the respective peripheries of the first, second and third as regions which protrude from the substrate regions to thereby project these regions; forming the silicon nitride film 33 (the second mask) on the side surface of the first projecting region; and oxidizing the surface of the substrate 1 which is not covered with the first nor second mask to form the field insulating film 2. Thus, it is possible to effect in the same manufacturing step the isolation between the bipolar transistors, between the MISFETs and also between the bipolar transistors and the MISFETs.

It should be noted that only the element isolation insulating film 2 in the region (memory cell region) within the four points $P_1$, $P_2$, $P_3$ and $P_4$ shown in FIG. 1 may be formed by the local oxidation of silicon (hereinafter referred to as "LOCOS"). The manufacturing process that utilizes LOCOS will be described hereinunder.

Figures 30A, 30B, 30C:
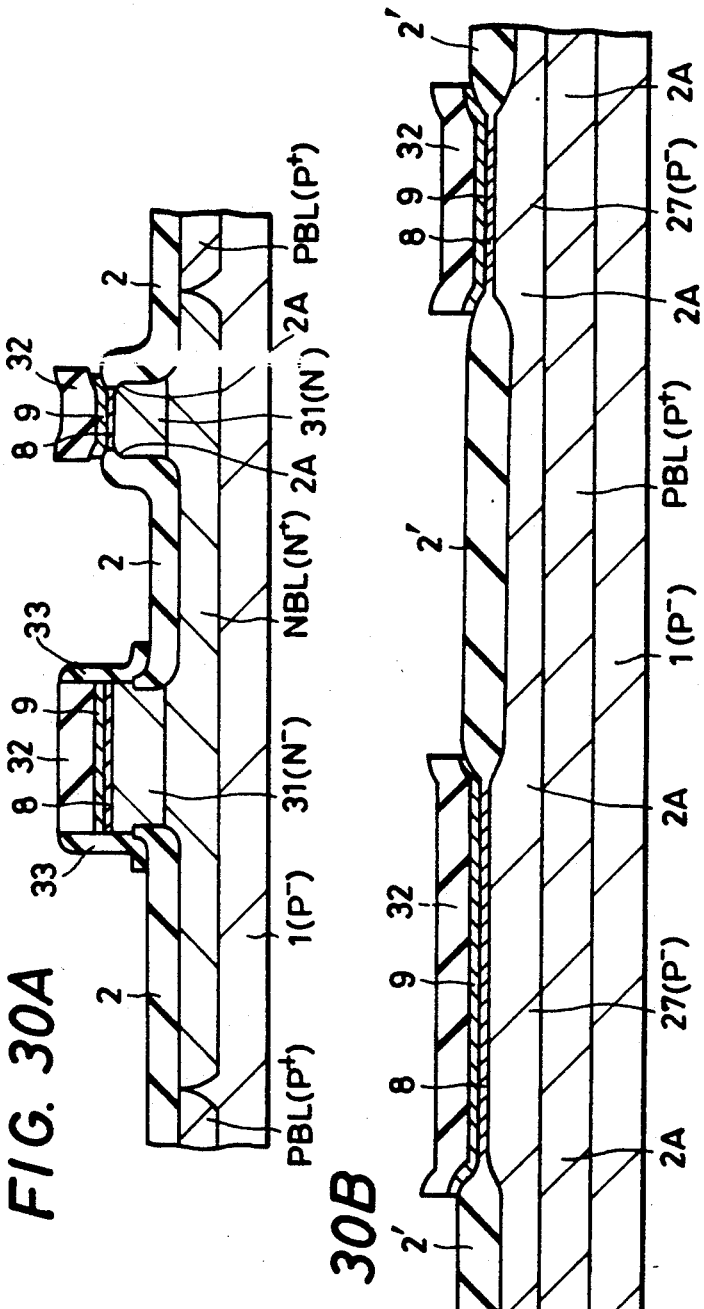

FIGS. 28A, 29A and 30A are sectional views showing the element isolating step carried out for the bipolar transistor forming region, while FIGS. 28B, 29B, 30B and FIGS. 28C, 29C, 30C are sectional views showing the element isolating step carried out for the memory cell forming region.

As shown in FIGS. 28A, 28B and 28C, after the formation of the silicon oxide film 32, a mask (not shown) defined by a photoresist is formed partially on the bipolar transistor forming region (the abovedescribed first and second regions) and on the whole surface of the memory cell forming region, and the well regions 27 and 31 which are not covered with this mask are subjected to anisotropic etching by way of example. As a result of the anisotropic etching, the following three regions are formed: a projecting region (first region) in which are provided the collector region 3, p+-semiconductor region 5, intrinsic base region 6 and emitter region 7 of a bipolar transistor; a projecting region (second region) in which the collector lead-out region 4 is provided; and a memory cell region (third region). After the anisotropic etching, the photoresist mask is removed. Thereafter, as shown in FIGS. 29A, 29B and 29C, only the silicon oxide film 32, the silicon nitride film 9 and the silicon oxide film 8 on that region within the memory cell region (third region) where an element isolation region is to be formed are removed by selective etching. Thereafter, a silicon nitride film 33 is formed on the whole surfaces of the well regions 27 and 31 by, for example, CVD, and the film 33 is etched by RIE until the upper surfaces of the well regions 27 and 31 are exposed, thereby forming a side wall defined by the silicon nitride film 33 on the side surface of the stack of the silicon oxide film 8, the silicon nitride film 9 and the silicon oxide film 32 in each of the well regions 27 and 31.

Thereafter, as shown in FIGS. 30A, 30B and 30C, a mask which is defined by a resist film is provided so as to cover only the projecting region in which are formed the collector region 3, P+-type semiconductor region 5, intrinsic base region 6 and emitter region 7 of the bipolar transistor, and the side walls 33 which are not covered with this mask are removed. This resist film is removed after the selective removal of the side walls 33. Next, field insulating films 2 and 2' (LOCOS) which are defined by a silicon oxide film are formed by thermal oxidation of the surface of each P−-well region 27 which is not covered with the stack of the silicon oxide film 32, the silicon nitride film 9 and the silicon oxide film 8 and the surface of each N−-well region 31 which is not covered with the side wall 33 nor the stack of the silicon oxide film 32, the silicon nitride film 9 and the silicon oxide film 8. Since the bottom of the field insulating film 2 reaches the buried layers NBL and PBL, the projecting portion which has its upper surface covered with the stack of the silicon oxide film 32, the silicon nitride film 9 and the silicon oxide film 8 is left alone in each of the P−- and N−-well regions 27 and 31 within the bipolar transistor forming region. The field insulating film (LOCOS) 2' performs isolation between the MISFETs within the memory cell forming region.

If necessary, a P-type impurity, e.g., boron, may be ion-implanted into the surface of each of the well regions 27 under the field insulating film 2' to form a P+-type channel stopper region in advance. In this case, boron may be selectively ion-implanted before the formation of the field insulating film 2', for example, in the stage of the process shown in FIGS. 29B and 29C.

Thereafter, a bipolar transistor and MISFETs are formed by carrying out steps similar to those described above and shown in FIGS. 12A, 12B, 12C to FIGS. 17A, 17B, 17C.

As described above, in the case where the insulating film for isolation between the MISFETs in the memory cell forming region is formed by LOCOS also, it is possible to effect in the same manufacturing step the isolation between the bipolar transistors and that between these bipolar transistors and the MISFETs.

Since the isolation provided in the memory cell forming region involves no etch step (i.e., level difference between each projecting region and its surroundings)

such as that employed for isolation between the bipolar transistors, it is possible to prevent disconnection of an interconnection layer formed on the memory cell forming region in the subsequent step.

Embodiment II

Figure 17A:
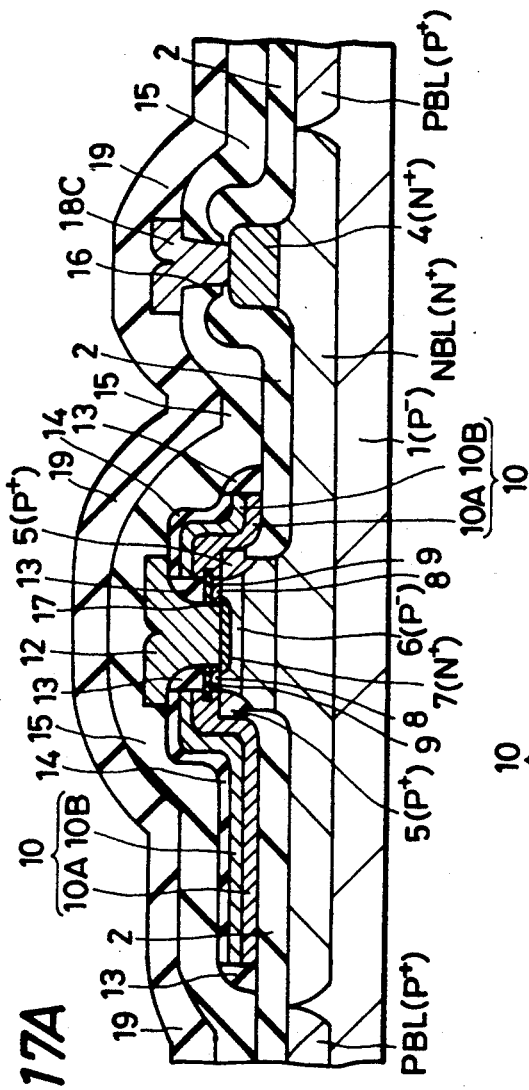
Figure 17B:
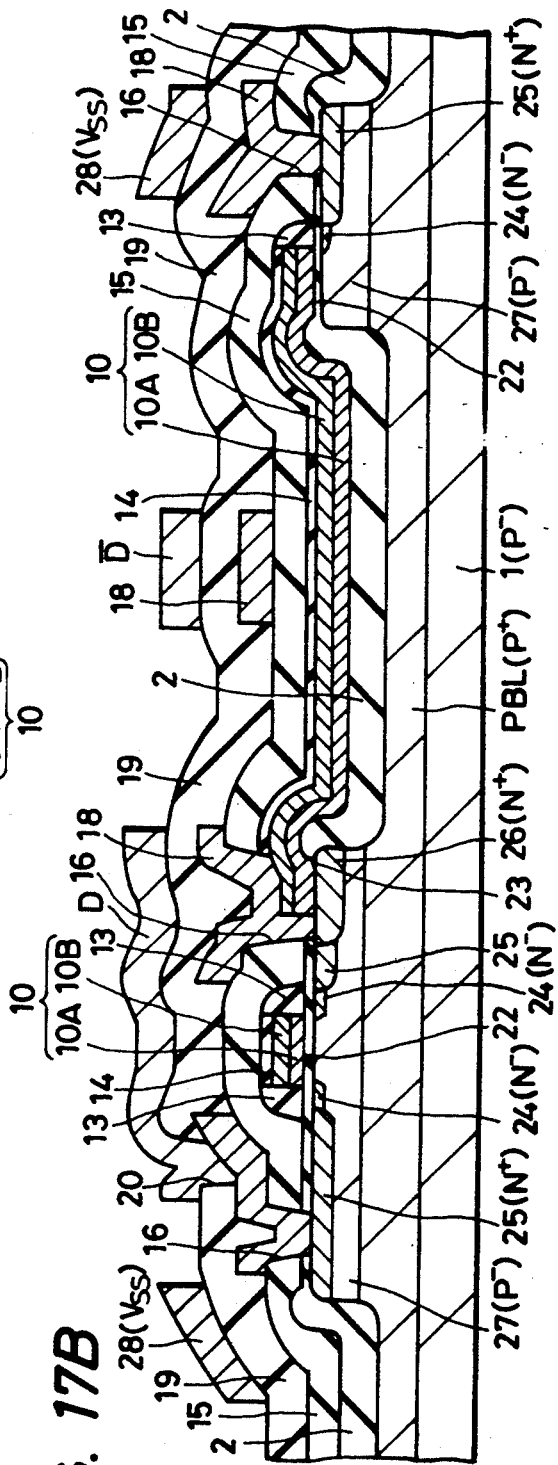
Figure 17C:
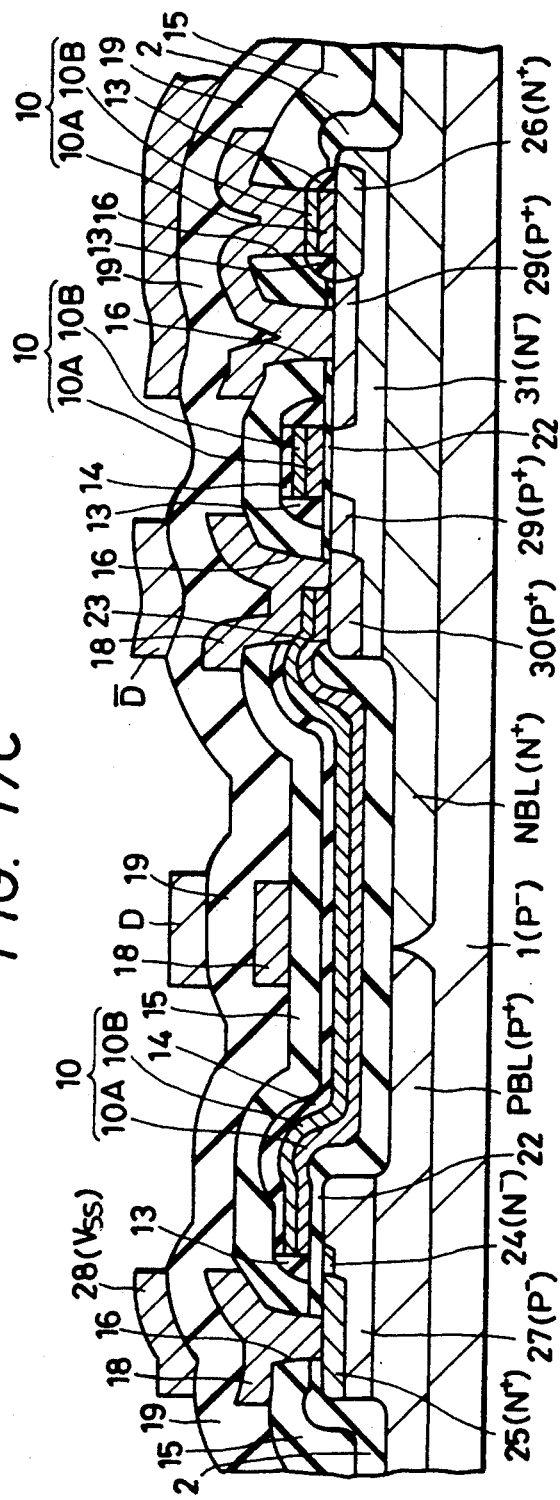

FIGS. 17A, 17B and 17C are sectional views showing in combination a semiconductor integrated circuit device according to the embodiment II of the present invention, in which: FIG. 17A is a sectional view of the same portion as that shown in FIG. 2; FIG. 17B is a sectional view of the same portion as that shown in FIG. 3; and FIG. 17C is a sectional view of the same portion as that shown in FIG. 4.

In this embodiment, the base electrode of the bipolar transistor, the gate electrode 10 of each of the P- and N-channel MISFETs $MP_1$, $MP_2$, $MN_1$, $MN_2$, $MN_3$, $MN_4$ and the interconnection 10 for feeding the power supply voltage Vcc are formed using a two-layer film comprising a polycrystalline silicon film 10A formed by, for example, CVD, and a film 10B of a refractory metal, for example, W, Mo, Ta, Ti, Pt or the like, or a film 10B of a silicide of such a refractory metal. Further, the emitter region 7 of the bipolar transistor is regulated by a side wall 13 provided on the base electrode 10, the side wall 13 being defined by a silicon oxide film formed by, for example, CVD, and the heavily-doped region 25 defining a part of each of the source and drain regions of each of the N-channel MISFETs $MN_1$, $MN_2$, $MN_3$, $MN_4$ is regulated by a side wall 13 which is formed in the same manufacturing step as that for the side wall 13 provided on the base electrode 10.

A silicon oxide film 14 is formed on the refractory metal or refractory metal silicide film 10B by, for example, CVD. After the formation of the polycrystalline silicon film 10A, an N-type impurity is introduced into that portion of the polycrystalline silicon film 10A which extends over the P+-buried layer PBL and into that portion of the film 10A which is present on the N+-buried layer NBL and which is used as a part of the interconnection 10 for feeding the power supply voltage Vcc, while a P-type impurity is introduced in the other portion of the polycrystalline silicon film 10A, to thereby lower the resistivity.

The N+-type semiconductor regions 26 in the memory cell forming region are formed by diffusion of an N-type impurity, e.g., phosphorus or arsenic, contained in the polycrystalline silicon film 10A, while the P+-type semiconductor region 30 is formed by diffusion of a P-type impurity [e.g., boron (B)] contained in the polycrystalline silicon film 10A. The P+-type semiconductor region 5 of the bipolar transistor is formed by diffusion of a P-type impurity [e.g., boron (B)] contained in the polycrystalline silicon film 10A.

The emitter electrode 12 of the bipolar transistor is defined by a second-level polycrystalline silicon film which is formed by, for example, CVD. The emitter electrode 12 is connected to the emitter region 7 through a contact hole 17 defined by the side wall 13 provided on the side surface of the base electrode 10 which is opened above the emitter region 7, together with the silicon nitride film 9 and the silicon oxide film 8. The thickness of the side wall 13 in the horizontal direction, that is, in the planar direction, can be controlled by adjusting the thickness of the silicon oxide film which is formed on the buried layers NBL and PBL in order to form the side wall 13. On the other hand, the emitter region 7 is formed by diffusion of an N-type impurity, e.g., phosphorus, contained in the emitter electrode (polycrystalline silicon film). However, the emitter region 7 may also be formed by ion implantation using a mask which is defined by a resist film.

As has been described above, the side wall 13, which is defined by the same layer as that for the side wall 13 which is provided on the side of the gate electrode 10 of each MISFET to regulate the heavily-doped region 25 of each of the source and drain regions, is provided around the opening which is provided in the base electrode 10 to allow the emitter electrode 12 to be connected to the emitter region 7, thereby regulating the emitter region 7, and thus enabling the emitter region 7 to be formed in self-alignment with the base electrode 10. Accordingly, it is possible to achieve reduction in the device size and high integration. Further, since the side wall 13 of the bipolar transistor and the side wall 13 of each MISFET are formed in the same manufacturing step, it is possible to prevent an increase in the number of manufacturing steps.

It should be noted that the arrangement may be such that a polycrystalline silicon film which is defined by the same layer as that for the emitter electrode 12 is provided as electrodes on the P+-type semiconductor region 29 which defines each of the source and drain regions of each of the P-channel MISFETs $MP_1$, $MP_2$ and on the N+-type semiconductor region 25 which defines a part of each of the source and drain regions of each of the N-channel MISFETs $MN_1$, $MN_2$, $MN_3$, $MN_4$, and the aluminum interconnections 18 are connected to these electrodes, thereby enabling the interconnections to be self-alignedly connected to the P+-type semiconductor region 29 and the N+-type semiconductor region 25. The portions of the gate insulating films 22 which are above the N+-type semiconductor region 25 and the P+-type semiconductor region 29 are removed when the side walls 13 are formed. In addition, the electrode which is defined by the polycrystalline silicon film on the N+-type semiconductor region 25 and the gate electrode 10 are isolated from each other by the silicon oxide film 14 and the side wall 13.

Embodiment III

In the embodiment III, a conductive layer which is the same layer as that for the base electrode of the bipolar transistor and a thermal oxidation mask 33 are insulatively provided around the collector lead-out region 4 and around the MISFET region, thereby flattening the surface of the substrate 1 and further suppressing the undesirable extension of the field insulating film 2 so as to eliminate a possible dimensional change.

This embodiment will be described hereinunder according to the manufacturing steps.

FIGS. 19A, 19B to FIGS. 22A, 22B are sectional views of the embodiment in the manufacturing steps, in which each of the numbers of these figures consists of an Arabic numeral and a letter in the alphabet, and each Arabic numeral denotes sectional views in the same step, while the letter A denotes the same section as that shown in FIG. 2, and B the same section as that shown in FIG. 3. It should be noted that no section such as that shown in FIG. 4 is illustrated.

As shown in FIGS. 19A and 19B, an N+-buried layer NBL, a P+-buried layer PBL, a P−-well region 27, an N−-well region 31, a silicon oxide film 8, a silicon nitride film 9 and a silicon oxide film 32 are formed, and then the P−-well region 27 and N−-well region 31 are patterned so that they are left in predetermined patterns, in the same way as in the steps carried in the embodiment I (from FIGS. 5A, 5B to 8A, 8B).

Figure 20B:
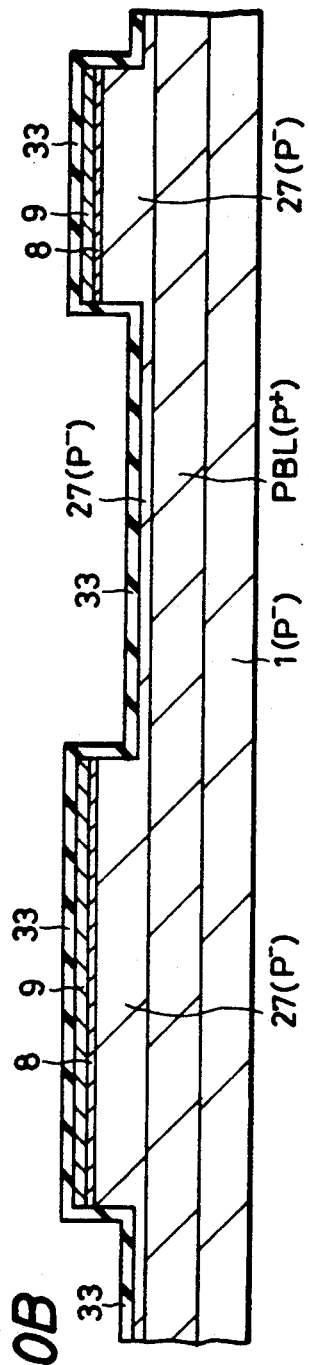

Next, as shown in FIGS. 20A and 20B, a silicon nitride film 33 is formed all over the upper surfaces of the N+-buried layer NBL and the P+-buried layer PBL by, for example, CVD.

Figure 21A:
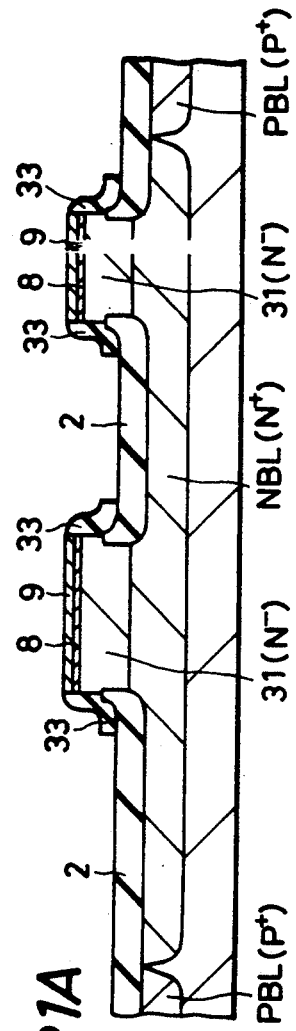
Figure 21B:
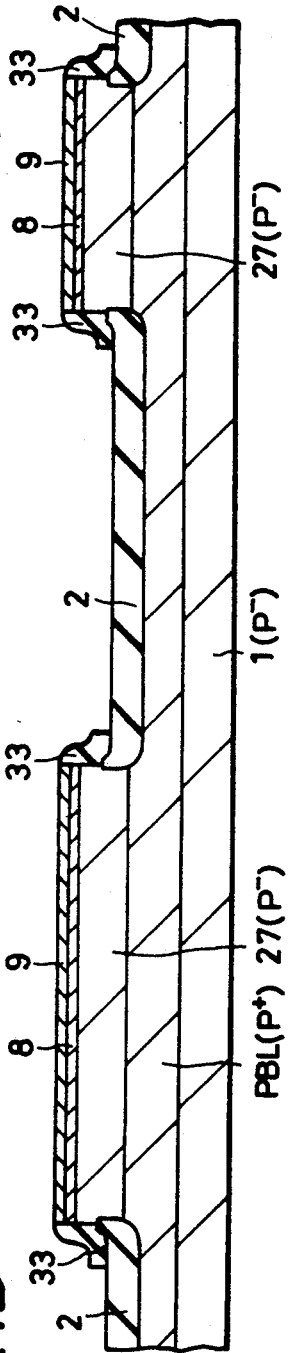

Next, as shown in FIGS. 21A and 21B, the silicon nitride film 33 is etched by RIE until the upper surfaces of the P-- and N--well regions 27 and 31 are exposed to thereby form side walls 33. Thereafter, the surfaces of the P-- and N--well regions 27 and 31 which are not covered with the silicon nitride film 9 nor the side walls 33 are subjected to thermal oxidation to form a field insulating film 2.

The field insulating film 2 is not formed on the upper surface of each projecting region but only on the side surface thereof not only in the projecting region in which are formed the collector region 3, P+-type semiconductor region 5, intrinsic base region 6 and emitter region 7 of the bipolar transistor, but also in the projecting region in which the collector lead-out region is formed and the projecting region in which each MISFET is formed. Accordingly, there is no fear of the field insulating film 2 undesirably extending into the above-described projecting or protruding regions, and therefore there is no dimensional change, that is, there is no difference in size of each projecting region before and after the formation of the field insulating film 2.

Next, as shown in FIGS. 22A and 22B, the side wall 33 only in the projecting region in which are provided the collector region 3, P+-type semiconductor region 5, intrinsic base region 6 and emitter region 7 is removed by etching using a mask which is defined by a resist film to thereby expose the side surface of the N--well region 31. Thereafter, a polycrystalline silicon film 10 is formed all over the upper sides of the N+-buried layer NBL and the P+-buried layer PBL by, for example, CVD. This polycrystalline silicon film 10 is deposited on the side surface of the N--well region 31 in the projecting region in which are formed the collector region 3, P+-type semiconductor region 5, intrinsic base region 6 and emitter region 7, but in the projecting region in which the collector lead-out region 4 is formed and in the projecting region in which each MISFET is formed, the polycrystalline silicon film 10 is isolated by the side wall 33. Next, a P-type impurity [e.g., boron (B)] is introduced into the polycrystalline silicon film 10 by, for example, ion implantation, and then annealing is carried out to lower the resistivity of the film 10. In addition, the above-described P-type impurity is diffused into the N--well region 31 on which the polycrystalline silicon film 10 is deposited to thereby form P+-type semiconductor region 5. Next, the portions of the polycrystalline silicon film 10 which are deposited on the upper sides of the projecting regions, that is, on the silicon nitride films 9, are mainly removed by etching using a mask which is defined by a resist film. The resist mask is removed after the etching. The polycrystalline silicon film 10 which is connected to the P+-type semiconductor region 5 is defined as a base electrode 10, and this polycrystalline silicon film 10 is separated from the polycrystalline silicon film 10 which is provided around the projecting region in which the collector lead-out region 4 is formed and that which is provided around the projecting region in which each MISFET is formed.

Since the area between the projecting regions is filled with the polycrystalline silicon film 10, it is possible to flatten the surface of the substrate 1. Next, the exposed surfaces of the polycrystalline silicon film 10 and base electrode 10 are subjected to thermal oxidation to form an insulating film 11 which is defined by a silicon oxide film. Next, that portion of the stack of the silicon nitride film 9 and the silicon oxide film 8 on the upper surface of each projecting region which is not covered with the insulating film 11 is etched to expose the surfaces of the P-- and N--well regions 27 and 31.

The steps which are carried out thereafter are the same as those which are carried out after the step shown in FIGS. 15, 16A, 16B and 16C in the embodiment I.

As has been described above, according to this embodiment, the field insulating film 2 around the projecting region (second projecting region) in which is provided the collector lead-out region 4 of the bipolar transistor and the field insulating film 2 around the projecting region (third projecting region) in which each MISFET is formed are arranged so as not to be provided on the upper surfaces of these projecting regions in the same way as in the case of the field insulating film 2 which is provided around the projecting region (first projecting region) in which are provided the collector region 3, P+-type semiconductor region 5, intrinsic base region 6 and emitter region 7 of the bipolar transistor. Thus, there is no fear of the field insulating film 2 undesirably extending into each of these projecting regions, and it is therefore possible to eliminate the occurrence of an undesired dimensional change.

Further, since the polycrystalline silicon film (conductive layer) 10 which is defined by the same layer as that for the base electrode 10 is left on the field insulating film 2, the area between the projecting regions is filled, and therefore it is possible to flatten the surface of the substrate 1.

Embodiment IV

Figure 23:
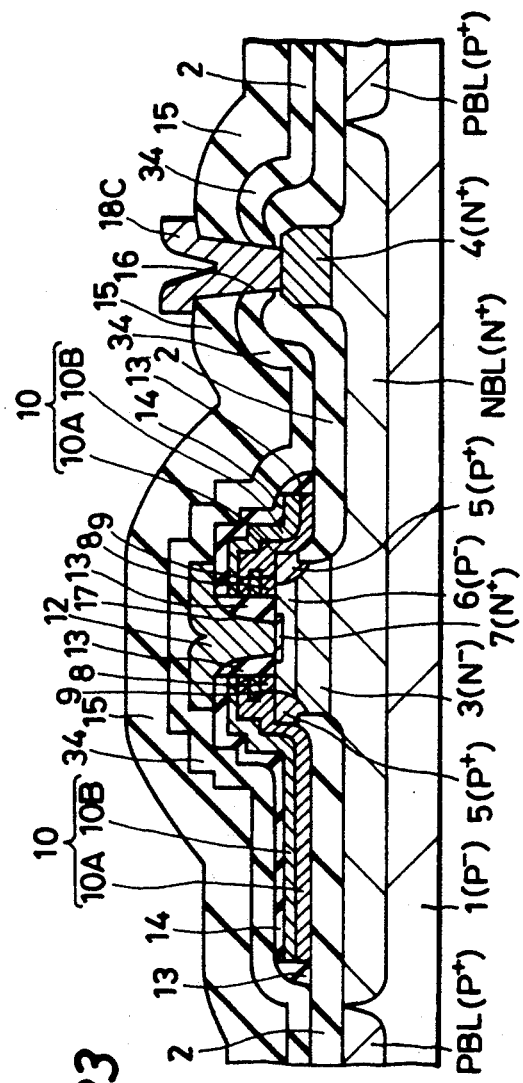
Figure 25:
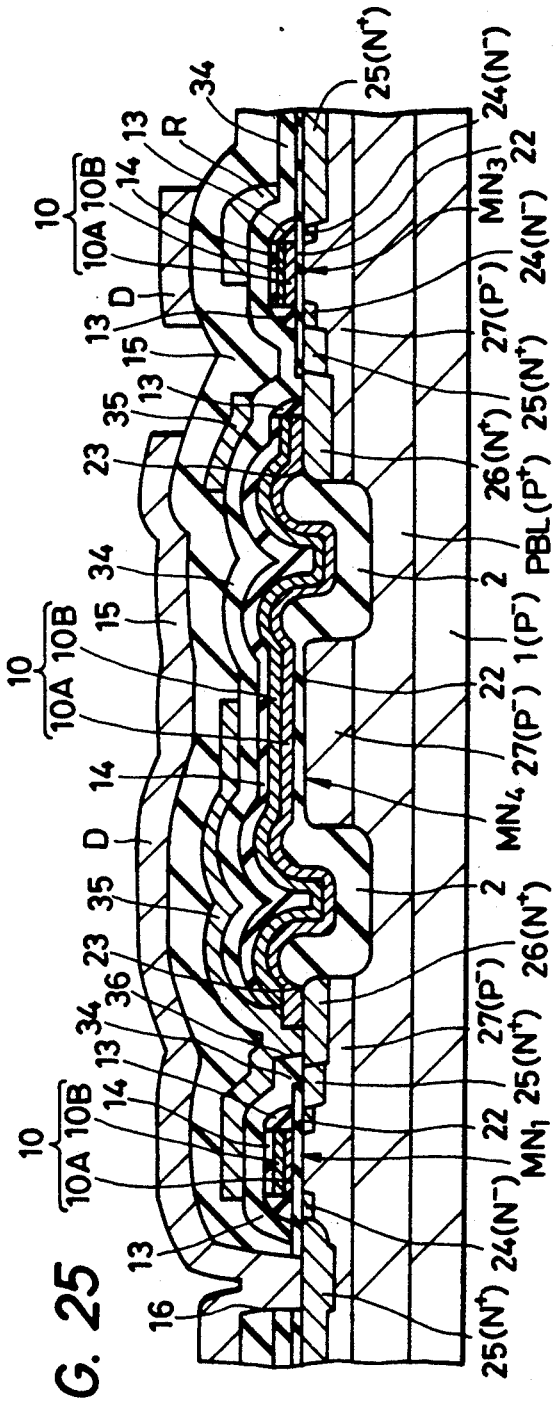

FIG. 23 is a sectional view of a bipolar transistor; FIG. 24A is a plan view of a memory cell in an SRAM, which shows only the first-level conductive layer of the cell, with the second- and third-level conductive layers removed; FIG. 24B is a plan view showing the memory cell of the SRAM with the first-level conductive layer removed; and FIG. 25 is a sectional view taken along the line I—I of FIG. 24. FIG. 25 shows all the conductive layers, that is, the first, second and third conductive layers. In FIGS. 24A and 24B, neither field nor interlayer insulating film is shown for the purpose of facilitating understanding of the arrangement of the elements.

The SRAM cell according to the embodiment IV comprises two resistors R having high resistance and four N-channel MISFETs $MN_1$, $MN_2$, $MN_3$, $MN_4$.

The base electrode 10 of the bipolar transistor, the gate electrode 10 of each of the N-channel MISFETs $MN_1$, $MN_2$, $MN_3$, $MN_4$, and the interconnection 10 for feeding the ground potential Vss to the substrate are each defined by a combination of a first-level polycrystalline silicon film 10A formed by, for example, CVD, and a refractory metal or refractory metal silicide film 10B stacked thereon. The polycrystalline silicon film 10A constituting the base electrode 10 has a P-type impurity, e.g., boron, introduced thereinto, while the polycrystalline silicon film 10A constituting the gate electrode 10 of each of the N-channel MISFETs MN$_1$, MN$_2$, MN$_3$, MN$_4$ and that for the interconnection 10 have an N-type impurity, e.g., phosphorus or arsenic, introduced thereinto. The interconnection 10 is connected with an interconnection 18 which is defined by a first-level aluminum film through a contact hole 16 provided by selectively removing the following three insulating films, that is, an insulating film 14 defined by a silicon oxide film formed by, for example, CVD, an insulating film 34 defined by a silicon oxide film, and an insulating film 15 defined by a combination of a silicon oxide film, a spin-on-glass film and a PSG film which are stacked in the mentioned order by, for example, CVD. The ground potential Vss is fed by this interconnection 18. The interconnection 18 is connected through a contact hole 16 to the surface of the N+-type semiconductor region 25 which defines a part of the source region of the MISFET MN$_4$. The load resistors R and the conductive layer 35 are defined by a second-level polycrystalline silicon film formed by, for example, CVD. The conductive layer 35 has an N-type impurity, e.g., phosphorus or arsenic, introduced thereinto by, for example, ion implantation so that the resistivity is lowered. The gate electrodes 10 and the interconnection 10, and also the conductive layer 35 and the load resistors R, are isolated from each other by the insulating film 34 defined by a silicon oxide film formed by, for example, CVD. The conductive layer 35 is connected to the upper surfaces of the gate electrodes 10 and the N+-type semiconductor regions 26 through contact holes 36 formed by removing the stack of the insulating film 34 and the insulating film 14 or the gate insulating film 22. The data lines D and $\overline{D}$ are defined by a first-level aluminum film formed by, for example, sputtering, and is connected through a contact hole 16 to one N+-type semiconductor region 25 of each of the MISFETs MN$_1$ and MN$_2$.

Each of the N-channel MISFETs MN$_1$, MN$_2$, MN$_3$, MN$_4$ is formed in an N−-well region 31 projecting from the surface of N+-buried layer NBL, and these N-channel MISFETs MN$_1$, MN$_2$, MN$_3$, MN$_4$ are isolated from each other by the field insulating film 2 and the P+-buried layer PBL.

As has been described above, it is possible according to the present invention to obtain advantageous effects similar to those offered by the embodiment I even in the case of a memory cell which is formed using high-resistance loads.

Embodiment V

Figure 26:
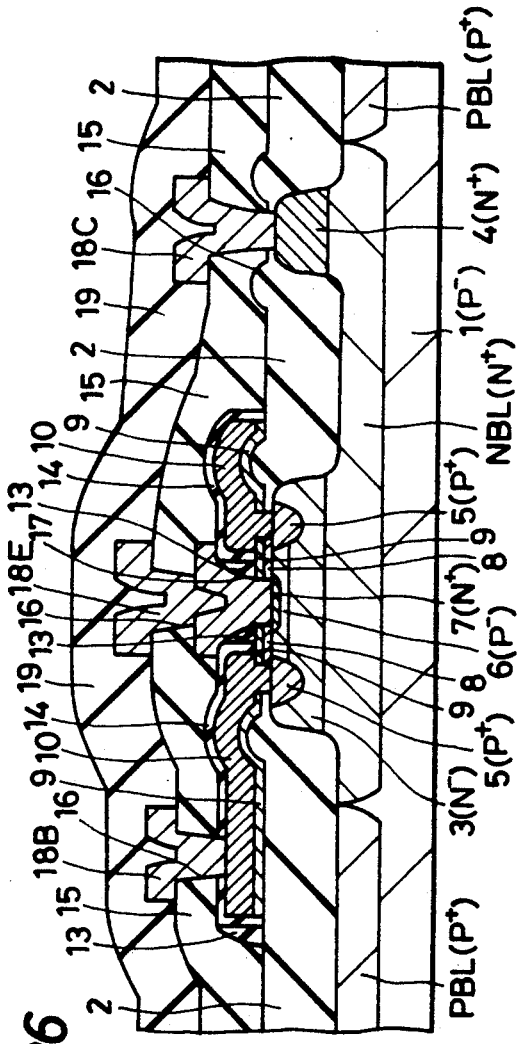
FIG. 26 is a sectional view of a bipolar transistor constituting a peripheral circuit of an SRAM according to the embodiment V.
Figure 27:
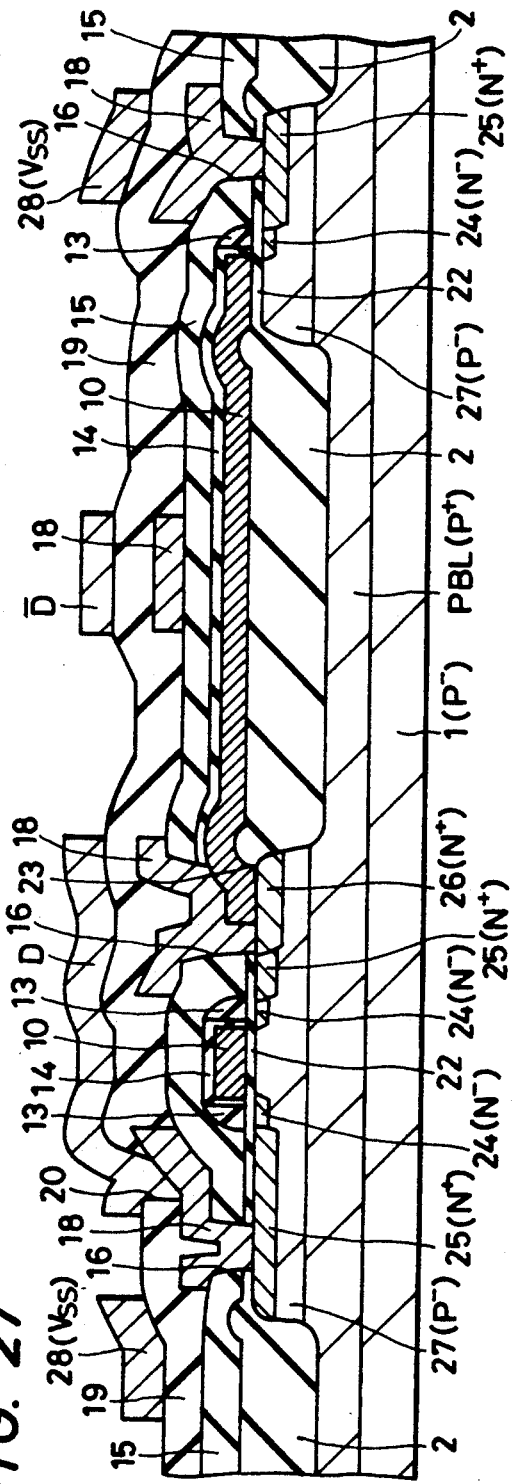
FIG. 27 is a sectional view of MISFETs constituting a memory cell in the SRAM according to the embodiment V.

FIG. 26 is a sectional view of a bipolar transistor formed by SEPT (Selective Etching of Polysilicon Technology) to constitute a peripheral circuit of an SRAM, and FIG. 27 is a sectional view of a memory cell of the SRAM formed on the same substrate as that of the bipolar transistor shown in FIG. 26, which shows the same portion as that shown in FIG. 3.

Referring to FIGS. 26 and 27, each of the following regions, that is, the region in which are formed the collector region 3, P+-type semiconductor region 5, intrinsic base region 6 and emitter region 7 of the bipolar transistor, the region in which the collector lead-out region 4 is formed, and the region in which each MISFET is formed, is provided such as to project from the surface of the N+-buried layer NBL or the P+-buried layer PBL, that is, the surface of the substrate 1. The field insulating film 2 is defined by a silicon oxide film formed by thermal oxidation of a single crystal silicon epitaxial layer. The base electrode 10, the gate electrodes 10, the word line WL and the interconnection 10 (corresponding to the interconnection 12 shown in the right-hand part of FIG. 1) for feeding the power supply voltage Vcc are defined by the same polycrystalline silicon film layer formed by, for example, CVD. Further, a side wall 13 which is defined by a silicon oxide film formed by, for example, CVD, is formed around each of the above-described constituent elements, that is, the base electrode 10, the gate electrodes 10, the word lone WL and the interconnection 10. The reference numeral 14 denotes an insulating film defined by a silicon oxide film which is formed by thermal oxidation of a polycrystalline silicon film.

Thus, in the case of an SEPT transistor also, the present invention enables obtainment of advantageous effects which are similar to those offered by the embodiment I.

Although the present invention has been described above specifically by way of embodiments, it should be noted here that the present invention is not necessarily limited to the described embodiments but rather various changes and modifications may, of course, be imparted thereto without departing from the gist of the invention.

Advantages effects which are obtained by practicing a typical one of the inventions disclosed in this application will be briefly explained below.

It is possible to provide isolation between MISFETs and between these MISFETs and bipolar transistors with the same isolation structure as that between the bipolar transistors by projecting each of the following regions from the surface of the substrate, that is, a first region for forming the base and emitter regions of each bipolar transistor, a second region for forming the collector lead-out region of the bipolar transistor, and a third region for forming each MISFET. Accordingly, it is possible to obtain a semiconductor integrated circuit device having a structure which facilitates element isolation.

Further, the technique of isolation between the bipolar transistors is effectively employed for isolation between the MISFETs and also between these MISFETs and the bipolar transistors by the process comprising the steps of: forming a first mask on each of the following regions on the substrate, that is, the first region in which the base and emitter regions of each bipolar transistor are provided, the second region in which the collector lead-out region of the bipolar transistor is provided, and the third region in which each MISFET is provided; etching the respective peripheries of the first, second and third regions to thereby project these regions; forming a second mask on the side surface of the first projecting region; and oxidizing the surface of the substrate which is not covered with the first nor second mask to form an element isolation insulating film. Thus, it is possible to effect in the same manufacturing step the isolation between the bipolar transistors, between the MISFETs and also between the bipolar transistors and the MISFETs.

Further, a side wall, which is defined by the same layer as that for the side wall which is provided on the side of the gate electrode of each MISFET to regulate a part of each of the source and drain regions, is provided around the opening which is provided in the base electrode of the bipolar transistor to allow the emitter electrode to be connected to the emitter region, thereby regulating the emitter region, and thus enabling the emitter region to be formed in self-alignment with the base electrode. Accordingly, it is possible to achieve reduction in the device size and high integration. Further, since the side wall of the bipolar transistor and the side wall of each MISFET are formed in the same manufacturing step, it is possible to prevent an increase in the number of manufacturing steps.

Further, the field insulating film around the second projecting region in which the collector lead-out region is provided and the field insulating film around the third projecting region in which each MISFET is formed are not provided on the upper surfaces of these projecting regions but disposed only on the side surfaces thereof in the same way as in the case of the field insulating film provided around the first projecting region in which the base and emitter regions are provided, so that there is no fear of the field insulating film undesirably extending into each of these projecting regions, and it is therefore possible is eliminate the occurrence of an undesired dimensional change.

What is claimed is:

1. A semiconductor memory device comprising:
   a semiconductor body having a main surface;
   a groove formed in said semiconductor body, said groove dividing said main surface, with respect to a plan view thereof, into a first region, a second region and a third region;
   a field oxide film selectively formed on said main surface in said first region, said field oxide film being formed so as to surround active regions at said main surface which are included in said first region;
   a plurality of memory cells formed at said main surface in said first region, each of said memory cells including CMOS inverters having input and output terminals cross-coupled to each other, and each of said CMOS inverters being comprised of a series connection of an n-channel MOSFET and a p-channel MOSFET, each of said n-channel and p-channel MOSFETs being formed at a respective one of said active regions in said first region;
   a peripheral circuit being comprised of a first NPN bipolar transistor and a second NPN bipolar transistor formed at said main surface in said second and third regions, respectively;
   a collector region of an N-type conductivity of said first and second NPN bipolar transistors formed at said main surface in said second and third regions, respectively;
   a base region of a P-type conductivity of said first and second NPN bipolar transistors formed in said collector region thereof, respectively;
   an emitter region of said N-type conductivity of said first and second NPN bipolar transistors formed in said base region thereof, respectively;
   a base lead-out electrode of each of said first and second NPN bipolar transistors formed over said main surface so as to surround said emitter region of each of said first and second NPN bipolar transistors, each said base lead-out electrode being electrically and self-alignedly connected to said base region thereof,
   an insulating side wall spacer formed on a side surface of said base lead-out electrode, said insulating side wall spacer being formed in self-alignment with said base lead-out electrode and defining said emitter region, in said base region thereof, of each of said first and second NPN bipolar transistors, wherein each said emitter region is formed in self-alignment with said base lead-out electrode thereof; and
   an emitter lead-out electrode of each of said first and second NPN bipolar transistors electrically connected to said emitter region thereof and being extended over said base lead-out electrode thereof, wherein each said emitter region is formed n self-alignment with said base lead-out electrode thereof by said insulating side wall spacer, wherein said insulating side wall spacer isolates each said emitter lead-out electrode from said base lead-out electrode thereof and defines the distance between said side surface of said base lead-out electrode and said emitter region corresponding to each of said first and second NPN bipolar transistors, wherein said first and second NPN bipolar transistors are isolated from each other by said groove in said semiconductor body, and wherein said n-channel and p-channel MOSFETs are isolated from each other by said field oxide film at said active regions in said first region.

2. A semiconductor memory device according to claim 1, wherein each said base region includes an extrinsic base region disposed under said base lead-out electrode corresponding thereof and an intrinsic base region which is surrounded by said base lead-out electrode thereof and is electrically contacted to said extrinsic base region thereof, and wherein each said emitter region is formed in said intrinsic base region corresponding thereto.

3. A semiconductor memory device according to claim 2, wherein each said extrinsic base region has an impurity concentration higher than that of said intrinsic base region corresponding thereto.

4. A semiconductor memory device according to claim 1, wherein each of said n-channel and p-channel MOSFETs has a gate electrode formed over said main surface via a gate insulating film, and wherein said gate electrode and aid base lead-out electrode are comprised of respective portions of a same level conductor layer in said memory device.

5. A semiconductor memory device according to claim 4, wherein said gate electrode and said base lead-out electrode are formed of a polycrystalline silicon layer, respectively.

6. A semiconductor memory device according to claim 4, wherein said gate electrode and said base lead-out electrode are formed of a polycrystalline silicon layer and a metal silicide layer stacked on said polycrystalline silicon layer, respectively.

7. A semiconductor memory device according to claim 4, wherein said gate electrode and said base lead-out electrode are formed of a polycrystalline silicon layer and a refractory metal layer stacked on said polycrystalline silicon layer, respectively.

8. A semiconductor memory device according to claim 4, wherein an insulating side wall spacer is formed on a side surface of said gate electrode, wherein said insulating side wall spacer formed on a side surface of said gate electrode and said insulating side wall spacer formed on said side surface of said base lead-out electrode are formed of a same level insulating layer in said memory device.

9. A semiconductor memory device according to claim 8, wherein said insulating side wall spacers of said base lead-out and gate electrodes are made of a silicon oxide 10. A semiconductor memory device according to claim 1, further comprising:
an insulating film formed under said insulating side wall spacer on said side surface of said base lead-out electrode,
wherein said insulating side wall spacer with said insulating film under said insulating side wall spacer isolates said emitter lead-out electrode from said base lead-out electrode.

11. A semiconductor memory device according to claim 10, wherein said insulating film under said insulating side wall spacer includes a silicon oxide film.

12. A semiconductor memory device according to claim 10, wherein said insulating film under said insulating side wall spacer includes a silicon oxide film layer and silicon nitride film layer stacked on said silicon oxide film.

13. A semiconductor memory device according to claim 10, wherein said insulating film under said insulating side wall spacer is disposed at the PN junction which is formed by said emitter and base regions of each of said first and second NPN bipolar transistors.

14. A semiconductor memory device according to claim 3, wherein each of said n-channel and p-channel MOSFETs has a gate electrode formed over said main surface via a gate insulating film, and wherein said gate electrode and said base lead-out electrode are comprised of respective portions of a same level conductor layer in said memory device.

15. A semiconductor memory device according to claim 14, wherein said gate electrode and said base lead-out electrode are formed of a polycrystalline silicon layer, respectively.

16. A semiconductor memory device according to claim 14, wherein said gate electrode and said base lead-out electrode are formed of a polycrystalline silicon layer and a metal silicide layer stacked on said polycrystalline silicon layer, respectively.

17. A semiconductor memory device according to claim 14, wherein said gate electrode and said base lead-out electrode are formed of a polycrystalline silicon layer and a refractory metal layer stacked on said polycrystalline silicon layer, respectively.

18. A semiconductor memory device according to claim 14, wherein an insulating side wall spacer is formed on a side surface of said gate electrode, wherein said insulating side wall spacer formed on a side surface of said gate electrode and said insulating side wall spacer formed on said side surface of said base lead-out electrode are formed of a same level insulating layer in said memory device.

19. A semiconductor memory device according to claim 18, wherein said insulating side wall spacers of said base lead-out and gate electrodes are made of a silicon oxide layer.

20. A semiconductor memory device according to claim 19, wherein said gate electrode and said base lead-out electrode are formed of a polycrystalline silicon layer and respectively.

21. A semiconductor memory device according to claim 19, wherein said gate electrode and said base lead-out electrode are formed of a polycrystalline silicon layer and a metal silicide layer stacked on said polycrystalline silicon layer, respectively.

22. A semiconductor memory device according to claim 19, wherein said gate electrode and said base lead-out electrode are formed of a polycrystalline silicon layer and a refractory metal layer stacked on said polycrystalline silicon layer, respectively.

23. A semiconductor memory device according to claim 10, wherein said base region includes an extrinsic base region disposed under said base lead-out electrode and an intrinsic base region which is surrounded by said base lead-out electrode and is electrically contacted to said extrinsic base region, and wherein said emitter region is formed in said intrinsic base region.

24. A semiconductor memory device according to claim 1, wherein said semiconductor body includes a semiconductor substrate and an epitaxial layer formed thereon, wherein said groove is formed in said epitaxial layer and divides said epitaxial layer into first, second and third island regions corresponding to said first, second and third regions of said main surface of said semiconductor body, and wherein said n-channel and p-channel MOSFETs are formed in said first island region, and said first and second NPN bipolar transistors are formed in said second and third island regions, respectively.

* * * * *